(12) United States Patent
Nishiyama

(10) Patent No.: US 7,039,567 B2
(45) Date of Patent: May 2, 2006

(54) SYSTEM IDENTIFICATION METHOD

(75) Inventor: Kiyoshi Nishiyama, Iwate (JP)

(73) Assignee: Japan Science and Technology Corporation, (JP)

(*) Notice: Subject to any disclaimer, the term of this patent is extended or adjusted under 35 U.S.C. 154(b) by 375 days.

(21) Appl. No.: 10/415,674

(22) PCT Filed: Oct. 16, 2001

(86) PCT No.: PCT/JP01/09082

§ 371 (c)(1),
(2), (4) Date: Oct. 17, 2003

(87) PCT Pub. No.: WO02/35727

PCT Pub. Date: May 2, 2002

(65) Prior Publication Data

(30) Foreign Application Priority Data

Oct. 24, 2000 (JP) .............................. 2000-323958

(51) Int. Cl.
G06F 17/50 (2006.01)
H04B 3/14 (2006.01)

(52) U.S. Cl. .............................. 703/2; 703/6; 706/300; 700/37; 708/323

(58) Field of Classification Search .................... 703/2, 703/6; 708/300, 323; 700/37; 706/300
See application file for complete search history.

(56) References Cited

U.S. PATENT DOCUMENTS

| | | | | |
|---|---|---|---|---|
| 5,394,322 A * | 2/1995 | Hansen | ........................ | 700/37 |
| 5,987,444 A * | 11/1999 | Lo | .............................. | 706/25 |
| 5,995,620 A * | 11/1999 | Wigren | .................. | 379/406.09 |
| 6,711,598 B1 * | 3/2004 | Pare et al. | .................. | 708/300 |
| 6,801,881 B1 * | 10/2004 | Shah | ............................. | 703/2 |

OTHER PUBLICATIONS

PCT Notification Of Transmittal of Copies Of Translation Of The International Preliminary Examination Report of International Application PCT/JP01/09082 filed Oct. 16, 2001, International Publication No. WO 02/35727 A1 published May 2, 2002.

(Continued)

*Primary Examiner*—Thai Phan
(74) *Attorney, Agent, or Firm*—Welsh & Katz, Ltd.; Thomas W. Tolpin

(57) ABSTRACT

Quick real-time identification and estimation of a time-non-varying or time-varying system. A new $H_\infty$ evaluation criterion is determined, a fast algorithm for a modified $H_\infty$ filter based on the criterion is developed, and a quick time-varying system identifying method according to the fast $H_\infty$ filtering algorithm is provided. By the fast $H_\infty$ filtering algorithm, a time-varying system sharply varying can be traced with an amount of calculation O(N) per unit time step. The algorithm completely agrees with a fast Kalman filtering algorithm at the extreme of the upper limit value. If the estimate of impulse response is determined, a pseudo-echo is sequentially determined from the estimate and subtracted from the real echo to cancel the echo. Thus an echo chancellor is realized.

4 Claims, 17 Drawing Sheets

OTHER PUBLICATIONS

Translation Of The International Preliminary Examination Report of International Application PCT/JP01/09082 filed Oct. 16, 2001, International Publication No. WO 02/35727 A1 published May 2, 2002.
International Application PCT/JP01/09082 filed Oct. 16, 2001, International Publication No. WO 02/35727 A1 published May 2, 2002 and related papers.
PCT International Search Report of International Application PCT/JP01/09082 filed Oct. 16, 2001, International Publication No. WO 02/35727 A1 published May 2, 2002.
PCT Notification of Receipt Of Record Copy of International Application PCT/JP01/09082 filed Oct. 16, 2001, International Publication No. WO 02/35727 A1 published May 2, 2002.
PCT Notification Concerning Submission or Transmittal Of Priority Document of PCT Notification of Receipt Of Record Copy of International Application PCT/JP01/09082 filed Oct. 16, 2001, International Publication No. WO 02/35727 A1 published May 2, 2002.
PCT Notice Informing the Applicant Of The Communication Of The International Application to the Designated Offices of PCT Notification of Receipt Of Record Copy of International Application PCT/JP01/09082 filed Oct. 16, 2001, International Publication No. WO 02/35727 A1 published May 2, 2002.
PCT Information Concerning Elected Offices Notified Of Their Election of PCT Notification of Receipt Of Record Copy of International Application PCT/JP01/09082 filed Oct. 16, 2001, International Publication No. WO 02/35727 A1 published May 2, 2002.
Declaration as Non-Prejudicial Disclosure Or Exceptions To Lack Of Novelty of International Application PCT/JP01/09082 filed Oct. 16, 2001, International Publication No. WO 02/35727 A1 published May 2, 2002.
Submission of Certificate of Exceptions To Lack Of Novelty Of Invention Application PCT/JP01/09082 filed Oct. 16, 2001, International Publication No. WO 02/35727 A1 published May 2, 2002.
Abstract: Japanese Publication No. 61-200713 published Sep. 5, 1986, Japanese Application No. 60-041053, filed Mar. 4, 1985, of OKI Electric Ind Co Ltd, inventors Kobayashi Masaki and Ito Yoshio, pertains to a Digital Filter.
Abstract: Japanese Publication No. 07-110693 published Apr. 25, 1995, Japanese Application No. 05-255877, filed Oct. 13, 1993, of Sharp Corp, inventors Eguchi Masaki and Kokubo Fumio, pertains to a Method And Device For Active Control Using Lattice Type Filter.
Publication: "*A State-Space Approach To Adaptive RLS Filtering*" by Ali H. Sayed and Thomas Kailath, published by *IEEE Signal Processing Magazine*, Jul. 1994, pp. 18-60.
Publication: "*Fast Filter And Its Tracking Performance For Time-Varying System Identification*" by Kiyoshih Nishiyama of Dep. Of Comp & Info. Science, Faculty of Engineering, Iware University, Japan, published by Proceeding of 15th Digital Signal Processing Symposium, pp. 191-196, Iwate, Japan.
Publication: "Digital Signal Processing Handbook", 1993, pp. 419-423 and 177-190.

* cited by examiner $$K_{a,k+1} = \hat{P}_{k+1|k}H_{k+1}^T(\rho + H_{k+1}\hat{P}_{k+1|k}H_{k+1}^T)^{-1}$$

NUMBER OF MULTIPLICATIONS IN $K_{a,k+1}$
= $N^2$ + ($N^2$+N) + N
= $2N^2$ + 2N ⟶ O($N^2$)

(a) FILTER GAIN $$\hat{x}_{k+1|k+1} = \hat{x}_{k|k} + K_{a,k+1}(y_{k+1} - H_{k+1}\hat{x}_{k|k})$$

NUMBER OF MULTIPLICATIONS IN $\hat{x}_{k+1|k+1}$
= N + N
= 2N ⟶ O(N)

(b) FILTER EQUATION

FIG. 2

$$R_{e,k} = R_k + \begin{bmatrix} H_k \\ H_k \end{bmatrix} \hat{P}_{k|k-1} [H_k^T \ H_k^T]$$

DIMENSION OF MATRIX

NUMBER OF MULTIPLICATIONS

NUMBER OF MULTIPLICATIONS IN $R_{e,k}(R_{e,k}^{-1}) = 2N^2 + 4N$ $= 2N^2 + 4N \longrightarrow O(N^2)$ (a) EQUATION OF $R_{e,k}$ $$\hat{P}_{k+1|k} = \hat{P}_{k|k-1} - \hat{P}_{k|k-1}[H_k^T \ H_k^T]R_{e,k}^{-1}\begin{bmatrix} H_k \\ H_k \end{bmatrix}\hat{P}_{k|k-1} + \Sigma_{wk}$$

DIMENSION OF MATRIX

NUMBER OF MULTIPLICATIONS

NUMBER OF MULTIPLICATIONS IN $\hat{P}_{k+1|k} = 2N^2 + 2N^2 + 2N^2 + 2N^2 + 2N^2 + 4N = 6N^2 + 4N \longrightarrow O(N^2)$ (b) RICCATI EQUATION

FIG.3

$$\tilde{e}_k = \underbrace{C_k}_{2\times 1} + \underbrace{C_k}_{2\times N} \underbrace{A_{k-1}}_{N\times 1}$$

NUMBER OF MULTIPLICATIONS IN $\tilde{e}_k =$ (2N)

$= 2N \longrightarrow O(N)$ $$e_k = \underbrace{C_k}_{2\times 1} + \underbrace{C_k}_{2\times N} \underbrace{A_k}_{N\times 1}$$

NUMBER OF MULTIPLICATIONS IN $e_k =$ (2N)

$= 2N \longrightarrow O(N)$ $$A_k = \underbrace{A_{k-1}}_{N\times 1} - \underbrace{K_k}_{N\times 2} \underbrace{W_k}_{2\times 2} \underbrace{\tilde{e}_k}_{2\times 1}$$

NUMBER OF MULTIPLICATIONS IN $A_k =$ (6N)

$= 6N \longrightarrow O(N)$ $$S_k = \underbrace{\rho}_{1\times 1} \underbrace{S_{k-1}}_{1\times 1} - \underbrace{e_k^T}_{1\times 2} \underbrace{W_k}_{2\times 2} \underbrace{\tilde{e}_k}_{2\times 1}$$

NUMBER OF MULTIPLICATIONS IN $S_k =$ (6) + (1)

$= 7 \longrightarrow O(1)$ (a) AMOUNT OF CALCULATION IN $\tilde{e}_k, A_k, e_k,$ AND $S_k$ $$\check{K}_k = \left( \underbrace{K_k}_{N\times 2} + \underbrace{A_k}_{N\times 1} \underbrace{S_k^{-1}}_{1\times 1} \underbrace{e_k^T}_{1\times 2} \right) \underbrace{\begin{pmatrix} m_k \\ \mu_k \end{pmatrix}}_{\substack{N\times 2 \\ 1\times 2}}$$

$\underbrace{S_k^{-1} e_k^T}_{1\times 1\ 1\times 2}$ → (2)

→ (3N)

NUMBER OF MULTIPLICATIONS IN $\check{K}_k =$ (3N) + (2)

$= 3N + 2 \longrightarrow O(N)$ $$\eta_k = \underbrace{C_{k-N}}_{2\times 1} + \underbrace{C_{k+1}}_{2\times N} \underbrace{D_{k-1}}_{N\times 1}$$

NUMBER OF MULTIPLICATIONS IN $\eta_k =$ (2N)

$= 2N \longrightarrow O(N)$ (b) AMOUNT OF CALCULATION IN $\check{K}_k,$ AND $\eta_k$

FIG.5

$$D_k = [\underbrace{D_{k-1}}_{N\times 1} - \underbrace{m_k}_{N\times 2}\underbrace{W_k}_{2\times 2}\underbrace{\eta_k}_{2\times 1}][\underbrace{I - \underbrace{\mu_k}_{1\times 2}\underbrace{W_k}_{2\times 2}\underbrace{\eta_k}_{2\times 1}}_{1\times 1}]^{-1}$$

NUMBER OF MULTIPLICATIONS IN $D_k$ = (6N) + (6) + (N)
= 7N + 6 ⟶ O(N)

$$K_{k+1} = \underbrace{m_k}_{N\times 2} - \underbrace{D_k}_{N\times 1}\underbrace{\mu_k}_{1\times 2}$$

NUMBER OF MULTIPLICATIONS IN $K_{k+1}$ ($K_{a,k+1}$) = (2N)
= 2N ⟶ O(N)

$$\hat{x}_{k+1|k+1} = \underbrace{\hat{x}_{k+1|k}}_{N\times 1} + \underbrace{K_{a,k+1}}_{N\times 1}(\underbrace{y_{k+1}}_{1\times 1} - \underbrace{H_{k+1}}_{1\times N}\underbrace{\hat{x}_{k+1|k}}_{N\times 1})$$

DIMENSION OF MATRIX = (N) + (N)
= 2N ⟶ O(N)

NUMBER OF MULTIPLICATIONS IN $\hat{x}_{k+1|k+1}$ = (N) + (N)

AMOUNT OF CALCULATION IN $D_k$, $K_{k+1}$ (FILTER GAIN), AND FILTER EQUATION

◯ : NUMBER OF MULTIPLICATIONS    ⌐ ¬ : DIMENSION OF MATRIX
      IN THE MATRIX CALCULATION     L ┘

FIG.6

| $h_0$ | $h_1$ | $h_2$ | $h_3$ | $h_4$ | $h_5$ |
|---|---|---|---|---|---|
| 0.0 | 0.008 | -0.012 | 0.064 | 0.013 | -0.052 |
| $h_6$ | $h_7$ | $h_8$ | $h_9$ | $h_{10}$ | $h_{11}$ |
| -0.007 | 0.039 | 0.011 | 0.0 | -0.002 | -0.009 |
| $h_{12}$ | $h_{13}$ | $h_{14}$ | $h_{15}$ | $h_{16}$ | $h_{17}$ |
| -0.016 | -0.013 | -0.001 | 0.004 | 0.015 | 0.013 |
| $h_{18}$ | $h_{19}$ | $h_{20}$ | $h_{21}$ | $h_{22}$ | $h_{23}$ |
| 0.007 | 0.0 | -0.001 | -0.002 | -0.001 | 0.0 |

FIG.7

| TAP NUMBER | MODIFIED $H_\infty$ FILTER (1) | MODIFIED $H_\infty$ FILTER (2) | FAST $H_\infty$ FILTER |
|---|---|---|---|
| 24 | 1.76 | 1.37 | 1.95 |
| 48 | 6.66 | 2.77 | 2.92 |
| 96 | 49.9 | 8.56 | 4.76 |
| 192 | 419.1 | 32.5 | 8.61 |
| 384 | $3.41 \times 10^3$ | 126.6 | 16.3 |

FIG.9

| TAP NUMBER | FAST HF [s] | FAST KF [s] | LMS [s] |
|---|---|---|---|
| 48 | 8.82 | 6.00 | 2.18 |
| 96 | 14.9 | 10.3 | 3.75 |
| 192 | 27.3 | 19.2 | 6.96 |
| 384 | 51.7 | 35.8 | 13.4 |

FIG.13

SYSTEM IDENTIFICATION METHOD

CROSS REFERENCES TO RELATED APPLICATIONS

This application is based upon priority International Application PCT/JP01/09082 filed Oct. 16, 2001, International Publication No. WO 02/35727 A1 published May 2, 2002, which is based upon Japanese Application 2000-323958 filed Oct. 24, 2000.

BACKGROUND OF THE INVENTION

The present invention relates to system identification methods, and more particularly, to a time-varying system identification method at a high speed in real time by using a fast algorithm for modified $H_\infty$ filters developed based on a new $H_\infty$ evaluation criterion.

In general, system identification is to estimate a mathematical model (a transfer function, an impulse response, or the like) of a system input-and-output relationship according to the input-and-output data. Typical applications thereof include echo cancellers in international communications, automatic equalizers in data communications, echo cancellers in acoustic systems, sound-field reproduction, and active noise control in vehicles. Details are written in "Digital Signal Processing Handbook", the Institute of Electronics, Information and Communication Engineers, 1993, or the like.

(Basic Principle)

FIG. 14 shows a configuration for system identification. This system includes an unknown system 1 and an adaptive filter 2. The adaptive filter 2 has an FIR digital filter 3 and an adaptive algorithm 4.

One case which uses an output error method to identify the unknown system 1 will be described below. Here, $u_k$ indicates an input to the unknown system 1, $d_k$ indicates the output of the system, which is a signal to be obtained, and $d^\wedge_k$ indicates the output of the filter. (A mark "^" means an estimated value and should be placed above characters, but it is placed at the upper right of the characters for input convenience. This notation may be used through the present specification.)

Since an impulse response is generally used as a parameter of an unknown system, the adaptive filter adjusts a coefficient of the FIR digital filter 3 by the adaptive algorithm such that an evaluation error $e_k = d_k - d^\wedge_k$ in the figure is minimized.

FIG. 15 shows the structure of an impulse-response adjustment mechanism.

Here, as an example of adaptive algorithm, the following LMS algorithm (least mean square algorithm) is widely used because of its computational simplicity.

[LMS Algorithm]

$$h_{k+1} = h_k + \mu u_k(y_k - u_k^T h_k) \quad (1)$$

where, $$h_k = [h_0[k], \ldots, h_{N-1}[k]]^T, u_k = [u_k, \ldots, u_{k-N+1}]^T, \mu > 0 \quad (2)$$

Generally, Kalman filters, which converges quickly, are suitable for identifying a time-varying system.

[Kalman Filter]

$$\hat{x}_{k|k} = \hat{x}_{k|k-1} + K_k(y_k - H_k \hat{x}_{k|k-1})$$

$$\hat{x}_{k+1|k} = \hat{x}_{k|k} \quad (3)$$

$$K_k = \hat{P}_{k|k-1} H_k^T (1 + H_k \hat{P}_{k|k-1} H_k^T)^{-1} \quad (4)$$

$$\hat{P}_{k|k} = \hat{P}_{k|k-1} - K_k H_k \hat{P}_{k|k-1}$$

$$\hat{P}_{k+1|k} = \hat{P}_{k|k} + \frac{\sigma_w^2}{\sigma_v^2} I \quad (5)$$

where, $$\hat{x}_{k|k} = [h_0[k], \ldots, h_{N-1}[k]]^T, H_k = [u_{k-1}, \ldots, u_{k-N}]$$

$$\hat{x}_{0|-1} = 0, \hat{P}_{0|-1} = \epsilon_0 I, \epsilon_0 > 0 \quad (6)$$

Here, the impulse response $\{h_i\}$ of unknown system is obtained as a state estimate $x^\wedge_{k|k}$, and an input $\{u_k\}$ to the system is used as an element of an observation matrix $H_k$.

Fast Kalman filtering algorithm is also known, which reduces the amount of calculation per unit time step to the number of times calculations are performed proportional to N, that is, $O(N)$ by applying the shift property ($H_{k+1}(i+1) = H_k(i)$) of the observation matrix $H_k$ to a Kalman filter obtained when $\sigma^2_w = 0$. Details are written in "Digital Signal Processing Handbook", the Institute of Electronics, Information and Communication Engineers, 1993, or the like.

(Applications to Echo Cancellers)

Four-wire circuits are used for long distance telephone lines such as for international calls for a reason of signal amplification and others. On the other hand, two-wire circuits are used for subscriber lines because they are relatively short.

FIG. 16 is an explanation view of a communication system and an echo. Impedance matching is performed by disposing hybrid transformers at connection points between two-wire circuits and a four-wire circuit, as shown in the figure. If the impedance matching is perfect, a signal (voice) from a speaker B reaches only a speaker A. However, it is difficult to make the matching perfect in general. A phenomenon occurs in which a part of a received signal leaks to the four-wire circuit, is amplified, and returns to the receiver (speaker A). This is an echo. As the transmission distance gets longer (delay time gets longer), the effect of the echo gets larger, and the quality of telephone speech significantly deteriorates (in pulse transmission, an echo influences significantly even in a short distance, and the quality of telephone speech deteriorates). FIG. 17 shows a basic principle of an echo canceller.

As shown in the figure, the echo canceller is introduced to successively estimate the impulse response of an echo path by using a received signal and an echo directly observable, and to subtract a quasi echo obtained by using the estimate from an actual echo to cancel and remove the echo.

The impulse response of the echo path is estimated such that the mean square error of a residual echo $e_k$ is minimized. Elements which disturb the estimation of the echo path are line noise and a signal (voice) from the speaker A. When two speakers start talking at the same time (double talking), the estimation of the impulse response is generally halted. Since the impulse response of the hybrid transformers has a length of approximately 50 [ms], if the sampling period is set to 125 [μs], the order of the impulse response of the echo path actually becomes approximately 400.

BRIEF SUMMARY OF THE INVENTION

In conventional arts, the LMS algorithm (least-mean-square algorithm) has been widely used as adaptive algorithm due to its simplicity, but it is impossible to closely track a time-varying system which varies suddenly due to its very slow convergence.

A Kalman filter, which has an excellent tracking performance, requires the amount of calculation proportional to $O(N^2)$ or $O(N^3)$. Since the amount of calculation rapidly increases with the tap number N, it is difficult to process actual issues requiring a high tap number N in real time. As a countermeasure therefor, a fast Kalman filter with the computational complexity of $O(N)$ per unit time step for a tap number N has been proposed, but it is impossible for the filter to identify a time-varying system because of its stationary characteristic (incapable of taking system noise into account).

In view of the above-described points, it is an object of the present invention to implement a fast real-time identification of time-varying and time-invariant systems by using a fast algorithm for modified $H_\infty$ filters developed based on a new $H_\infty$ evaluation criterion. It is another object of the present invention to include, as a particular case of the present algorithm, a fast Kalman filtering algorithm, and to determine theoretically the covariance of system noise which is dominant in the tracking performance of time-varying systems. It is still another object of the present invention to provide a fast time-varying system identification method which is substantially effective even when an input signal is discontinuously varied, such as in an echo canceller for a time-varying system which varies extremely as sudden line switching. It is a further object of the present invention to provide a system identification method which is applicable to echo cancellers in communication systems and acoustic systems, sound-field reproduction, and noise control.

In order to solve the problems described above, a new $H_\infty$ evaluation criterion is introduced, a fast algorithm for the modified $H_\infty$ filters is developed according to the criterion, and a fast time-varying system identification method based on the fast algorithm is proposed in the present invention. The fast algorithm according to the present invention is capable of tracking a time-varying system which varies rapidly, with the complexity of $O(N)$ per unit time step. Further, it has a convenient property that it completely matches the fast Kalman filtering algorithm at a limit of $\gamma_f = \infty$.

A more detailed explanation of the invention is provided in the following description and appended claims take in conjunction with the accompanying drawings.

BRIEF DESCRIPTION OF THE DRAWINGS

FIG. 2 is an explanation view (1) of the amount of calculation in each part of a modified $H_\infty$ filtering algorithm.

FIG. 3 is an explanation view (2) of the amount of calculation in each part of the modified $H_\infty$ filtering algorithm.

FIG. 5 is an explanation view (1) of the amount of calculation in a fast $H_\infty$ filtering algorithm.

FIG. 6 is an explanation view (2) of the amount of calculation in the fast $H_\infty$ filtering algorithm.

FIG. 7 is a view showing values of an impulse response $\{h_i\}$ to be estimated.

FIG. 9 is a view of measurement results of computation time.

FIG. 13 is a view showing the relationship among tap numbers and computation times of impulse responses obtained by the fast $H_\infty$ filter, fast Kalman filter, and LMS algorithm.

DETAILED DESCRIPTION OF THE INVENTION

Figure 1:
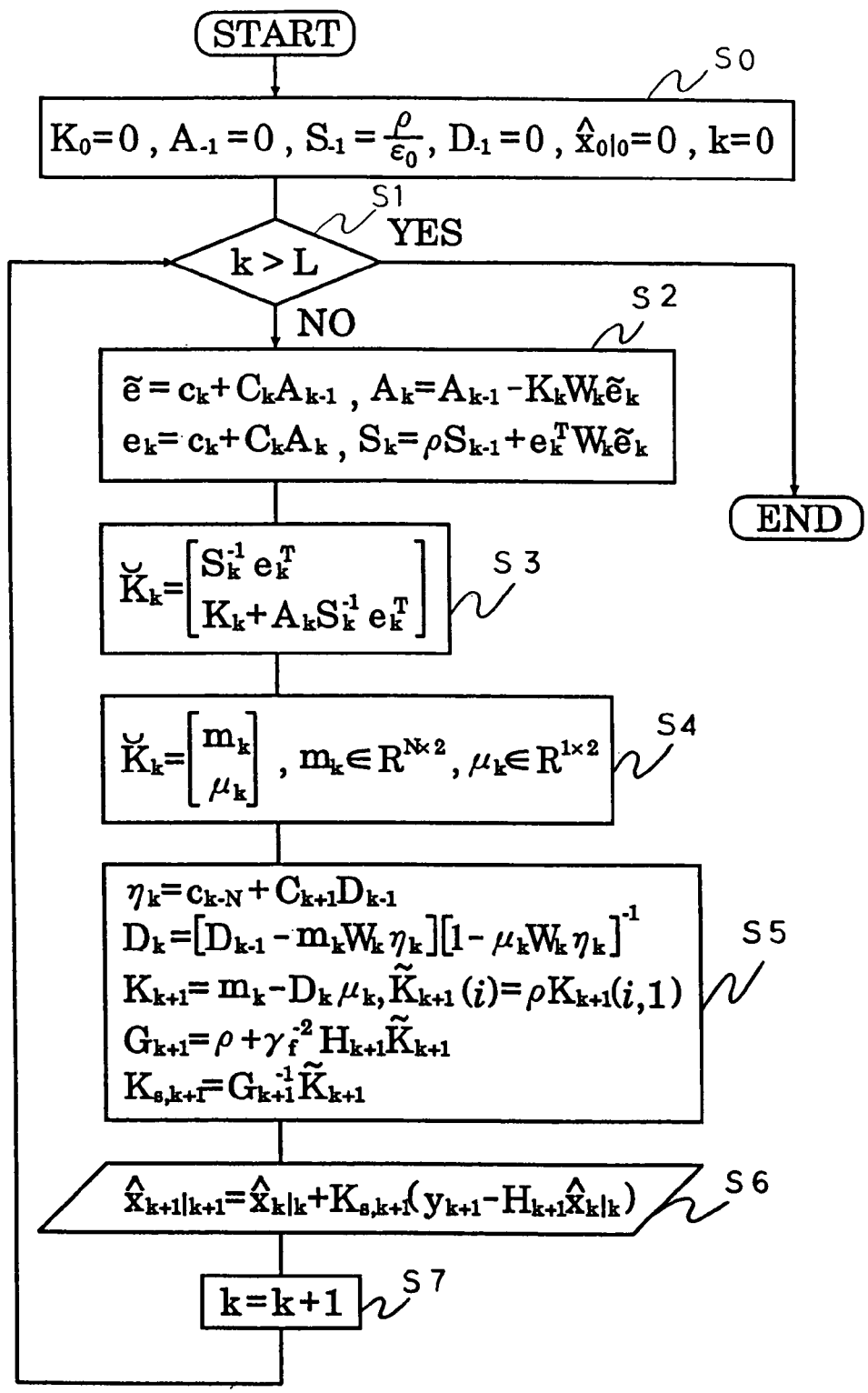
FIG. 1 is a flowchart of a fast algorithm.

A detailed description of the preferred embodiments and best modes of practicing the present invention are described hereinafter. Details are shown, for example, in "Derivation of A Fast Algorithm of Modified $H_\infty$ Filters", K. Nishiyama, IEEE international Conference on Industrial Electronics, Control and Instrumentation, RBC-II, pp. 462–467, October, 2000.

1. Description of Symbols

First, main symbols used in the embodiments of the present invention and whether they are known or unknown will be described.

$x_k$: State vector or just state, unknown and to be estimated.
$x_0$: Initial state, unknown.
$w_k$: System noise, unknown.
$v_k$: Observation noise, unknown.
$y_k$: Observation signal, known and input to a filter.
$z_k$: Output signal, unknown.
$H_k$: Observation matrix, known.
$L_k$: Output matrix, known.
$\hat{x}_{k|k}$: State value of the state $x_k$ at time k, estimated by using observation signals $y_0$–$y_k$. Given by a filter equation.
$\hat{x}_{0|0}$: Initial estimate of a state, essentially unknown but set to 0 for convenience.
$K_{s,k+1}$: Filter gain, obtained by matrix $\hat{P}_{k|k-1}$.
$\Sigma_{w,k}$: Corresponds to the covariance matrix of the system noise, known in theory but unknown in practice.
$\hat{P}_{k|k-1}$: Corresponds to the covariance matrix of the error of $\hat{X}_{k|k-1}$, given by a Riccati equation.
$P_{1|0}$: Corresponds to the covariance matrix of an error in the initial state, essentially unknown but set to $\epsilon_0 I$ for convenience.
$\sigma^2_v$: Variance of the observation noise, treated as known in theory but unknown in practice.
$\sigma^2_w$: Variance of the system noise, treated as known in theory but unknown in practice.

A mark "^" placed above a symbol indicates an estimated value, a mark "U" indicates that the matrix is extended by one row, and a mark "~" is added for convenience. These marks are placed at the upper right of characters for input convenience, but, as shown in expressions, they are identical with those placed above characters. "L", "H", "P", and "K" indicate matrixes. Some of them are written in boldface as in expressions, but they are usually written in lightface for convenience.

2. Modified $H_\infty$ Filter

Next, a state-space model as in the following equations (7) to (9) is discussed.

$$x_{k+1} = x_k + w_k, \; w_k, \; x_k \in R^N \quad (7)$$

$$y_k = H_k x_k + v_k, \; y_k, \; v_k \in R \quad (8)$$

$$z_k = H_k x_k, \; z_k \in R, \; H_k \in R^{1 \times N} \quad (9)$$

where, $L_k = H_k (H_k = [u_k u_{k-2} \ldots u_{k-N+1}])$ assuming an echo canceller or the like. For such a state-space model, an $H_\infty$ evaluation criterion ($\gamma_f$ is newly placed in the left-hand side) such as that shown by expression (10) is proposed.

$$\sup_{x_0, \{\omega_i\}, \{v_i\}} \frac{\sum_{i=0}^{k} \|e_{f,i}\|^2/\rho}{\|x_0 - \check{x}_{0|-1}\|^2_{\Sigma_0^{-1}} + \sum_{i=0}^{k} \|\omega_i\|^2_{\Sigma_{\omega_i}^{-1}} + \sum_{i=0}^{k} \|v_i\|^2/\rho} < \gamma_f^2 \quad (10)$$

When it is assumed that $\rho$ or $\Sigma_{wk}$ does not depend on $\gamma_f$, a modified $H_\infty$ filter of level $\gamma_f$ satisfying the evaluation criterion can be given by the following equations (11) to (14) by applying a standard $H_\infty$ estimation scheme known in the system identification field. This scheme is shown, for example, in "Linear Estimation in Krein Spaces—Part I: Theory," B. Hassibi, A. H. Sayed, and T. Kailath, IEEE Trans. Automatic Control, 41, 1, pp. 18–33, 1996., and "Linear Estimation in Krein Spaces—Part II: Applications," B. Hassibi, A. H. Sayed, and T. Kailath, IEEE Trans. Automatic Control, 41, 1, pp. 34–49, 1996.

$$\check{z}_{k|k} = H_k \hat{x}_{k|k} \quad (11)$$

$$\hat{x}_{k+1|k+1} = \hat{x}_{k|k} + K_{s,k+1}(y_{k+1} - H_{k+1} \hat{x}_{k|k}) \text{ Filter equation} \quad (12)$$

$$K_{s,k+1} = \hat{P}_{k+1|k} H_{k+1}^T (H_{k+1} \hat{P}_{k+1|k} H_{k+1}^T + \rho)^{-1} \text{ Filter gain} \quad (13)$$

Riccati equation (14)

$$\hat{P}_{k+1|k} = \hat{P}_{k|k-1} - \hat{P}_{k|k-1} [H_k^T H_k^T] R_{e,k}^{-1} \begin{bmatrix} H_k \\ H_k \end{bmatrix} \hat{P}_{k|k-1} + \Sigma_{wk}$$

where, $$e_{f,i} = \check{z}_{i|i} - H_i x_i \quad (15)$$

$$R_{e,k} = R_k + \begin{bmatrix} H_k \\ H_k \end{bmatrix} \hat{P}_{k|k-1} [H_k^T H_k^T]$$

$$R_k = \begin{bmatrix} \rho & 0 \\ 0 & -\rho\gamma_f^2 \end{bmatrix}, \; \Sigma_{wk} = \gamma_f^{-2} \hat{P}_{k+1|k}$$

$$\hat{P}_{k|k-1}^{-1} + H_k^T H_k > 0, \; \hat{P}_{1|0} = \varepsilon_0 I, \; \varepsilon_0 > 0$$

$$0 < \rho = 1 - \gamma_f^{-2} \le 1, \; \gamma_f > 1$$

Since a weight $\rho$ in the evaluation criterion depends on an upper limit $\gamma_f$ determined in advance, the above algorithm is essentially different from that applied to normal $H_\infty$ filters. The present algorithm controls a maximum energy gain from disturbances (having the initial state $x_0$, the system noise $\{w_i\}$, and the observation noise $\{v_i\}$) weighted by $\rho$ to a filter error $\{e_{f,i}\}$ so as to be smaller than $\gamma_f^2$. Therefore, the present algorithm is a robust filtering algorithm against the disturbances. This property is reflected by the tracking characteristic of a time-varying system. When $\gamma_f \to \infty$ is satisfied, $\rho = 1$ and $\Sigma_{wk} = 0$. In this time, the modified $H_\infty$ filter becomes a standard Kalman filter.

The main load for calculating the modified $H_\infty$ filter rises during the update of $\hat{P}_{k+1|k} \in R^{N \times N}$, which requires the amount of calculation in proportion to $N^2$ or $N^3$. That is, an arithmetic operation of $O(N^2)$ per unit time step is required. Here, a tap number $N$ matches the dimension of the state vector $x_k$. Therefore, as the dimension of $x_k$ increases, the computation time required to perform the modified $H_\infty$ filter increases rapidly. In order to overcome the drawback, the introduction of a fast algorithm of the modified $H_\infty$ filter is needed.

3. Fast $H_\infty$ Filtering Algorithm

The calculation of the Riccati equation (covariance equation of a state estimation error) shown in equation (14) is dominant in the computational complexity of the modified $H_\infty$ filter. Therefore, to process the modified $H_\infty$ filter at a high speed, if the filter gain of equation (13) is directly determined without using the Riccati equation, the computational burden can be significantly reduced.

Since it is difficult to derive a fast algorithm for directly obtaining a filter gain $K_{s,k} \in R^{N \times 1}$, however, evolving an algorithm for fast calculating a gain matrix defined as follows is examined.

$$K_k = P_k C_k^T \in R^{N \times 2} \quad (16)$$

where, $$p_k = [O_k^T \Omega_k O_k]^{-1} = \left[ \sum_{i=1}^{k} \rho^{k-i} C_i^T W_i C_i \right]^{-1} \quad (17)$$

$$\Omega_k = \begin{bmatrix} \rho \Omega_{k-1} & 0 \\ \hline 0 & W_k \end{bmatrix}, \; \Omega_1 = W_1,$$

$$W_i = \rho R_i^{-1} = \begin{bmatrix} 1 & 0 \\ 0 & -\gamma_f^{-2} \end{bmatrix} \in R^{2 \times 2}$$

$$O_k = \begin{bmatrix} C_1 \\ \vdots \\ C_k \end{bmatrix}, \; C_i = \begin{bmatrix} H_i \\ H_i \end{bmatrix} \in R^{2 \times N}.$$

Here, the following lemmas are formed.

Lemma 1

A matrix $P_k$ satisfies the Riccati equation of (14). Therefore, when a gain matrix $K_k$ is obtained, the filter gain $K_{s,k}$ is immediately obtained from the following lemma.

Lemma 2

The filter gain $K_{s,k}$ of the modified $H_\infty$ filter is obtained by using the gain matrix $K_k$ as shown below. In practice, the gain matrix $K_k$ can be fast calculated by the recursive method in Lemma 3.

$$K_{s,k} = G_k^{-1} \tilde{K}_k, \quad G_k = \rho + \gamma_f^{-2} H_k \tilde{K}_k \in R \quad (18)$$

where, $$\tilde{K}_k(i) = \rho K_k(i, 1), \quad i = 1, 2, \ldots, N. \quad (19)$$

Lemma 3

The gain matrix $K_k$ is updated as follows.

$$K_{k+1} = m_k - B_k F_k^{-1} \mu_k \in R^{N \times 2} \quad (20)$$

Here, $m_k \in R^{N \times 2}$ and $\mu_k \in R^{1 \times 2}$ are obtained by dividing a matrix of $K^U_k = Q^U_k{}^{-1} C^U_k$ as shown below.

$$\begin{bmatrix} m_k \\ \mu_k \end{bmatrix} = \begin{bmatrix} 0 \\ K_k \end{bmatrix} + \begin{bmatrix} S_k^{-1} \\ A_k S_k^{-1} \end{bmatrix} [c_k^T + A_k^T C_k^T] \quad (21)$$

Auxiliary variables $A_k \in R^{N \times 1}$, $S_k \in R$, and $B_k F^{-1}{}_k \in R^{N \times 1}$ are obtained as well.

In conclusion, the fast $H_\infty$ filtering algorithm can be summarized as below.

FIG. 1 shows a flowchart of the fast algorithm, where L indicates a maximum data length.

[Step 0] Set initial conditions of a recursive expression as follows, where $\epsilon_0$ is a substantially large positive constant.

$$K_0 = 0, \, A_{-1} = 0, \, S_{-1} = \frac{\rho}{\epsilon_0}, \, D_{-1} = 0, \, \hat{x}_{0|0} = 0$$

[Step 1] Compare time k with the maximum data length L. When the time k is larger than the maximum data length, terminate the processing. When the time k is equal to or smaller than the maximum data length, the processing proceeds to the next step (a conditional statement can be removed, if unnecessary).

[Step 2] Determine $A_k$ and $S_k$ recursively as follows.

$$\begin{aligned}
\tilde{e}_k &= c_k + C_k A_{k-1} & \in R^{2 \times 1} \\
A_k &= A_{k-1} - K_k W_k \tilde{e}_k & \in R^{N \times 1} \\
e_k &= c_k + C_k A_k & \in R^{2 \times 1} \\
S_k &= \rho S_{k-1} + e_k^T W_k \tilde{e}_k & \in R
\end{aligned}$$

[Step 3] Calculate $K^U_k$ as follows.

$$\check{K}_k = \begin{bmatrix} S_k^{-1} e_k^T \\ K_k + A_k S_k^{-1} e_k^T \end{bmatrix} \in R^{(N+1) \times 2}$$

[Step 4] Divide $K^U_k$ as follows.

$$\check{K}_k = \begin{bmatrix} m_k \\ \mu_k \end{bmatrix} \quad m_k \in R^{N \times 2}, \mu_k \in R^{1 \times 2}$$

[Step 5] Determine $D_k$, and obtain a gain matrix $K_{s,k+1}$ from $K_{k+1}$ as follows:

$$\eta_k = c_{k-N} + C_{k+1} D_{k-1}$$

$$D_k = [D_{k-1} - m_k W_k \eta_k][1 - \mu_k W_k \eta_k]^{-1}$$

$$K_{k+1} = m_k - D_k \mu_k$$

$$\tilde{K}_{k+1}(i) = \rho K_{k+1}(i, 1), \, i = 1, \ldots, N$$

$$K_{s,k+1} = G_{k+1}^{-1} \tilde{K}_{k+1}, \quad G_{k+1} = \rho + \gamma_f^{-2} H_{k+1} \tilde{K}_{k+1}$$

where, $\eta_k \in R^{2 \times 1}$, $D_k \in R^{N \times 1}$, $K_{k+1} \in R^{N \times 2}$, $K_{s,k+1} \in R^{N \times 1}$, $0 < \rho = 1 - \gamma_f^{-2} \leq 1$, $\gamma_f > 1$.

[Step 6] Update the filter equation of the $H_\infty$ filter as follows.

$$\hat{x}_{k+1|k+1} = \hat{x}_{k|k} + K_{s,k+1}(y_{k+1} - H_{k+1} \hat{x}_{k|k})$$

[Step 7] Put the time k forward (k=k+1). The processing returns to Step 2, and the subsequent processes are repeated as long as the data exists.

Lemma 6 (Existence Condition Suitable for Fast Processing)

The existence of the fast $H_\infty$ filter can be checked with the computational complexity of O(N) by using the following existence condition.

[Existence Condition]

$$-I \hat{\Xi} i + \rho \gamma_f^2 > 0, \, i = 0, \ldots, k \quad (22)$$

where, $$\varrho = 1 - \gamma_f^2, \, \hat{\Xi}_i = \frac{H_i \tilde{K}_i}{1 - H_i \tilde{K}_i} \quad (23)$$

4. Computational Complexity of the Present Fast Algorithm

Next, how the computational complexity of the fast $H_\infty$ filtering algorithm decreases, as compared with the computational requirement of the modified $H_\infty$ filtering algorithm, will be discussed. Only the number of multiplications is used for evaluating the amount of calculation of an equation, and is calculated by the following method. Number of multiplications when a J-by-K matrix is multiplied by a K-by-L matrix is J×K×L (times).

Here, when three or more matrixes or vectors are multiplied, they are calculated from the left unless a direction is specially shown in the figure.

(Computational Complexity of the Modified $H_\infty$ Filtering Algorithm)

FIGS. 2 and 3 are views showing of the amount of calculation of each part of the modified $H_\infty$ filtering algorithm, where N indicates a tap number (the dimension of the state vector $X_k$). In FIG. 3(*a*), a calculation for obtaining $R_{e,k}^{-1}$ from $R_{e,k}$ is ignored. Similarly, in FIG. 2(*a*), a calculation for obtaining $(H_{k+1} P_{k+1|k} H^T_{k+1} + 1)^{-1}$ from $(H_{k+1} P_{k+1|k} H^T_{k+1} + 1)$ is also ignored.

As shown in FIGS. 2(*a*), 3(*a*), and 3(*b*), the amount of calculation of each of $K_{s|k+1}$, $R_{e,k}$, and $P^{\hat{}}_{k+1|k}$ is in proportion to the square of the tap number. Therefore, the amount of calculation of the entire modified $H_\infty$ filtering algorithm is $O(N^2)$ per unit time step.

Figure 4:
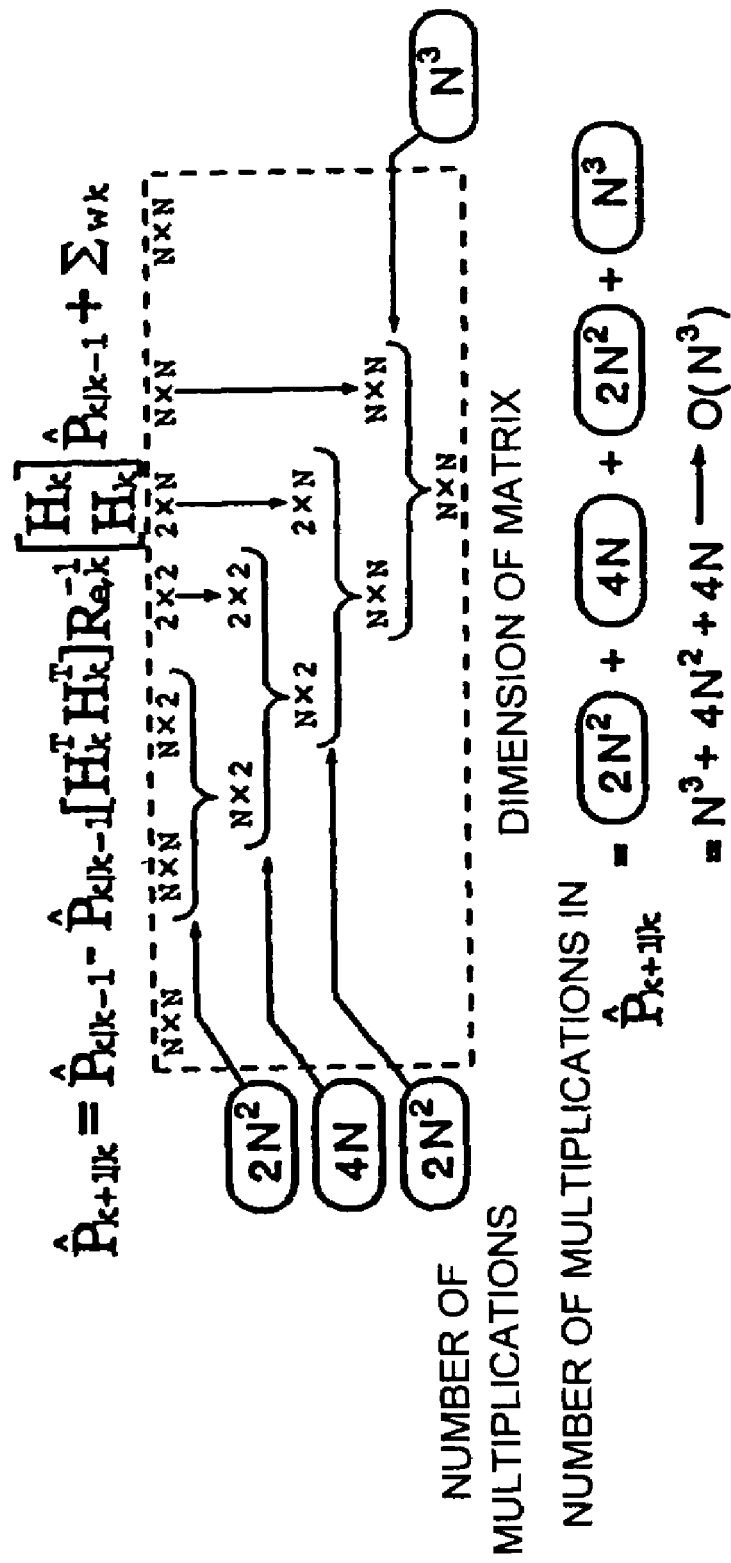
FIG. 4 is an explanation view of the amount of calculation in the Riccati recursion.

FIG. 4 is a view showing the amount of calculation required when the order of matrix calculations is changed. More specifically, FIG. 4 shows the amount of calculation required when the order of matrix calculations of the second term on the right-hand side is changed in the Riccati equation.

Since the amount of calculation of the above-described part is proportional to the cube of the tap number, the amount of calculation of $P^\wedge_{k+1|k}$ is also in proportion to the cube of the tap number. Accordingly, the amount of calculation of the entire $H_\infty$ filter increases from the square to the cube of the tap number.

Since either algorithm requires the amount of calculation proportional to the square or cube of the tap number, however, the computational burden for carrying out the filter increases significantly as the tap number increases. In fact, since a tap number used in the field of communication engineering, for example, is approximately 400, the practical use of the algorithm becomes very difficult.

(Computational Complexity of the Fast $H_\infty$ Filtering Algorithm)

FIGS. 5 and 6 are views showing the amount of calculation in the fast $H_\infty$ filtering algorithm. In the expression of $K^u_k$ in FIG. 5(b), $S_k^{-1}$ is obtained from $S_k$, but the calculation thereof is ignored. Similarly, in the expression of $D_k$ in FIG. 6(b), a calculation for obtaining $[1-\mu_k W_k \eta_k]^{-1}$ from $[1-\mu_k W_k \eta_k]$ is also ignored.

The amount of calculation in the entire present fast algorithm is O(N) per unit time step according to FIGS. 5 and 6. Therefore, the amount of calculation in the fast $H_\infty$ filtering algorithm is in proportion to the tap number. In this case, the amount of calculation (the number of multiplications) for performing the fast $H_\infty$ filter once is 28N+16 per unit step, and is approximately double the amount (multiplication frequency) of calculation required for a fast Kalman filter, that is 12N+3.

As described above, although the computational complexity proportional to the square or cube of the tap number is required for the modified $H_\infty$ filtering algorithm, the computational complexity of the present fast algorithm is smaller and proportional to the tap number.

5. Echo Canceller

The advantage of the present invention will be examined, with an echo canceller being taken as an example.

An observation value $\{y_k\}$ of an echo $\{d_k\}$ is expressed in the following expression by an (time-varying) impulse response $\{h_i[k]\}$ of an echo path, where it is considered that a received signal $\{u_k\}$ is an input signal to the echo path:

$$y_k = d_k + v_k = \sum_{i=0}^{N-1} h_i[k] u_{k-i} + v_k, k = 0, 1, 2, \ldots \quad (24)$$

where, $u_k$ and $y_k$ indicate, respectively, the received signal and the echo at time $t_k$ (=kT, T is a sampling period); $v_k$ indicates circuit noise having zero mean at time $t_k$; and $h_i[k]$ (i=0, ..., and N−1) is a time-varying impulse responses assuming a gradual change, and the tap number N thereof is known. Once estimated values $\{\hat{h}_i[k]\}$ of the impulse response are obtained, a quasi echo is generated as follows by using the estimated values.

$$\hat{d}_k = \sum_{i=0}^{N-1} \hat{h}_i[k] u_{k-i}, k = 0, 1, 2, \ldots \quad (25)$$

Subtracting this from the echo ($y_k - \hat{d}_k \approx 0$), the echo is cancelled, where $u_{k-i} = 0$ when k−i<0.

From the above description, the echo canceller problem is equivalent to successively estimating the impulse response $\{h_i[k]\}$ of the echo path from the received signal $\{u_k\}$ and echo $\{y_k\}$, both of which are directly observable.

In general, when the $H_\infty$ filter is applied to an echo canceller, equation (24) has to be expressed by a state-space model formed of a state equation and an observation equation. In this case, since the state vector to be obtained is the impulse response $\{h_i[k]\}$, allowing a state vector $x_k$ to fluctuate with $w_k$, the following state-space model can be constructed for the echo path.

$$x_{k+1} = x_k + w_k, \qquad x_k, w_k \in R^N \quad (26)$$
$$y_k = H_k x_k + v_k, \qquad y_k, v_k \in R \quad (27)$$
$$z_k = H_k x_k, \qquad z_k \in R, H_k \in R^{1 \times N} \quad (28)$$

where, $x_k = [h_0[k], \ldots, h_{N-1}[k]]^T$, $w_k = [w_k(1), \ldots, w_k(N)]^T$ $H_k = [u_k, \ldots, u_{k-N+1}]$, $L_k = H_k$ Modified $H_\infty$ filtering algorithm and fast $H_\infty$ filtering algorithm for such a state-space model are the same as those described above. While the impulse response is estimated, if the occurrence of a transmission signal is detected, the estimation is generally stopped in the meanwhile.

Thus, when an estimate $\{\hat{h}_i[k]\}$ of the impulse response is obtained, the quasi echo is successively obtained therefrom as follows.

$$\hat{d}_k = H_k \hat{x}_{k|k} = \sum_{i=0}^{N-1} \hat{h}_i[k] u_{k-i} \quad (29)$$

Therefore, subtracting this from an actual echo to cancel the echo, an echo canceller is implemented. Here, an estimate error, $e_k = y_k - \hat{d}_k$, is called a residual echo.

6. Evaluation for Time-Invariant Impulse Response (Evaluation of Estimation Accuracy)

A modified $H_\infty$ filter and a fast $H_\infty$ filter are evaluated by simulation in a case in which the impulse response of an echo path is time-invariant ($h_i[k] = h_i$) and the tap number N thereof is 24.

$$y_k = \sum_{i=0}^{23} h_i u_{k-i} + v_k \quad (30)$$

FIG. 7 is a view showing values of the impulse response $\{h_i\}$ in this case. $v_k$ is stationary Gaussian white noise having zero mean and variance $\sigma_v^2$ of $1.0 \times 10^{-6}$, and a sampling period T is set to 1.0 for convenience.

The received signal $\{u_k\}$ is approximated by a quadratic AR model as shown below.

$$u_k = \alpha_1 u_{k-1} + \alpha_2 u_{k-2} + w_k' \quad (31)$$

where, $\alpha_1 = 0.7$, $\alpha_2 = 0.1$, and $w_k'$ is stationary Gaussian white noise having zero mean and variance $\sigma_w^2$ of 0.04.

The modified $H_\infty$ filter and the fast $H_\infty$ filter will be compared.

Figure 8:
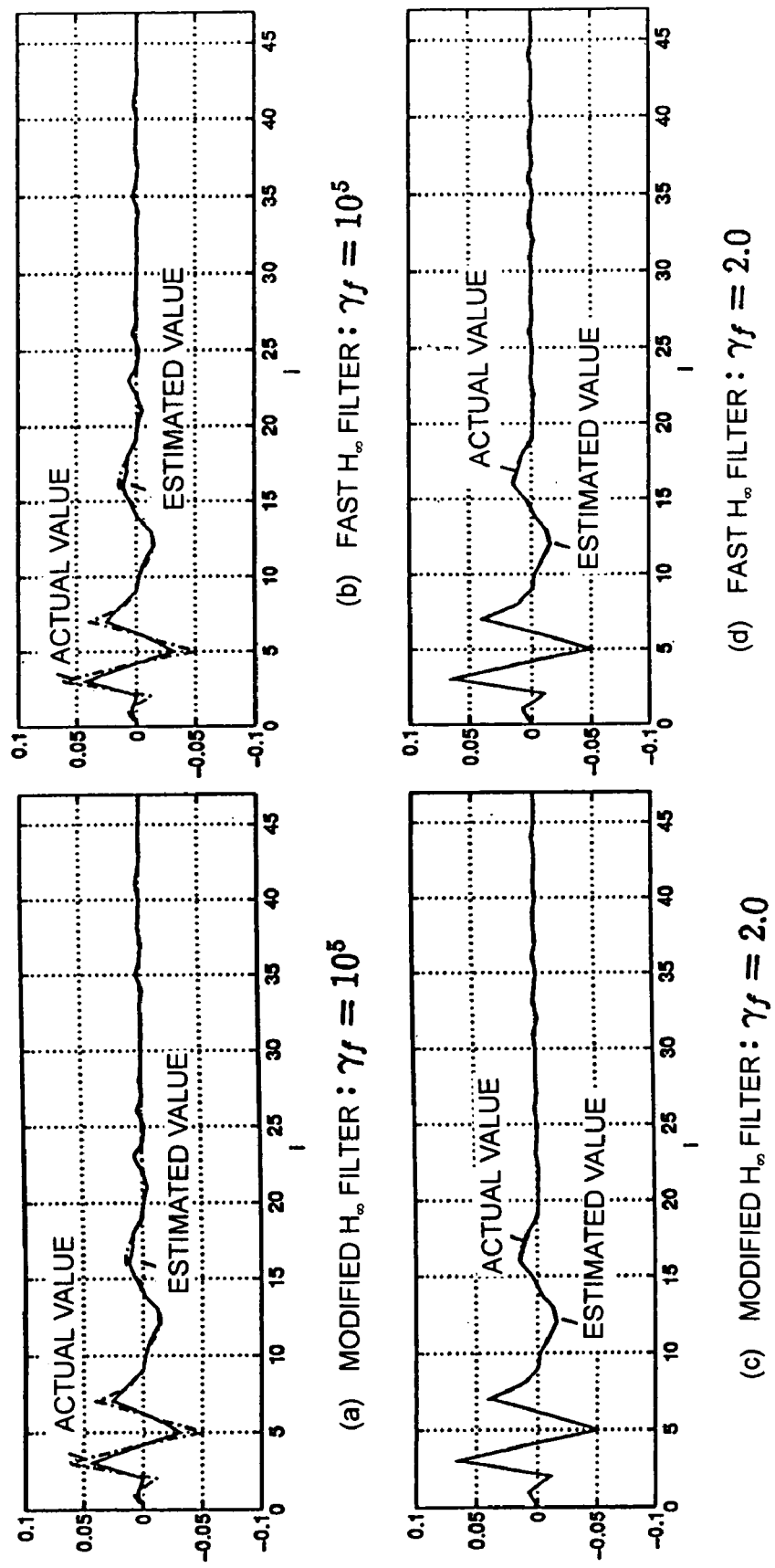
FIG. 8 is a comparative explanation view of estimated results of impulse responses obtained by the modified $H_\infty$ filter and the fast $H_\infty$ filter.

FIG. 8 includes views showing estimated results of the impulse responses of the modified $H_\infty$ filter and the fast $H_\infty$ filter (initial value $\hat{x}_{0|0}=0$, $\epsilon_o=20$). FIGS. 8(a) and (b) show estimated results of both filters when $\gamma_f=10^5$, and FIGS. 8(c) and (d) show estimated results ($\hat{x}_{100|100}$) thereof when $\gamma_f=2.0$. From the figures, performance on the estimation accuracy of both filters is equal. In other words, speeding-up does not reduce the estimation accuracy. Note that, if $\gamma_f$ is too small, the existence condition of the filters is not satisfied. When $\gamma_f=1.0\times 10^5$, the results are substantially equal to that of a fast Kalman filter. Therefore, it is found that the fast $H_\infty$ filtering algorithm includes the fast Kalman filtering algorithm and its convergence rate can be accelerated by adjusting $\gamma_f$.

(Evaluation of Computation Time)

Next, the computation time required for the modified $H_\infty$ filter and that for the fast $H_\infty$ filter are evaluated under conditions where the impulse response of the echo path is time-invariant and the tap number is increased to 24, 48, 96, 192, and 384. Since dispersion may occur in one measurement, the average of four measurements was used. The values shown in FIG. 7 are used as impulse responses $\{h_i\}$ in simulation, and impulse responses $\{h_i\}$ thereafter ($24 \leq k < N$) are set to 0. The filter calculation is performed up to step 100. The computation time was measured by a command "etime" of MATLAB on a workstation (sparc, 60 MHz, 32 MB).

FIG. 9 is a view showing measurement results of the computation time. In the Riccati equation, matrix calculation is performed for a modified $H_\infty$ filter (2) such that the amount of calculation is in proportion to the square of the tap number, and matrix calculation is performed for a modified $H_\infty$ filter (1) such that the amount of calculation is in proportion to the cube of the tap number (see FIG. 3(b) and FIG. 4). In modified $H_\infty$ filters, since the computational complexity is in proportion to the square or cube of the tap number depending on the order of matrix calculation as described above, they are not practical.

7. Evaluation for Time-Varying Impulse Response (Evaluation of Tracking Performance)

The tracking performance of each algorithm will be evaluated by using the echo canceller in a case in which the system (impulse response) is varied with time. It is assumed that the tap number of the impulse response is 48, and $\{h_i\}$ is varied with time, as shown in FIG. 10(a), based on the values shown in FIG. 7. It is also assumed that $v_k$ is stationary Gaussian white noise having zero mean and variance $\sigma_v^2$ of $1.0\times 10^{-6}$, and the sampling period T is set to 1 for convenience. The received signal $\{u_k\}$ is approximated by a quadratic AR model as follows.

$$u_k = \alpha_1 u_{k-1} + \alpha_2 u_{k-2} + w_k' \quad (32)$$

Here, $\alpha_1 = 0.7$, $\alpha_2 = 0.1$, and $w_k'$ is stationary Gaussian white noise having zero mean and variance $\sigma_w^2$ of 0.04.

Figure 10:
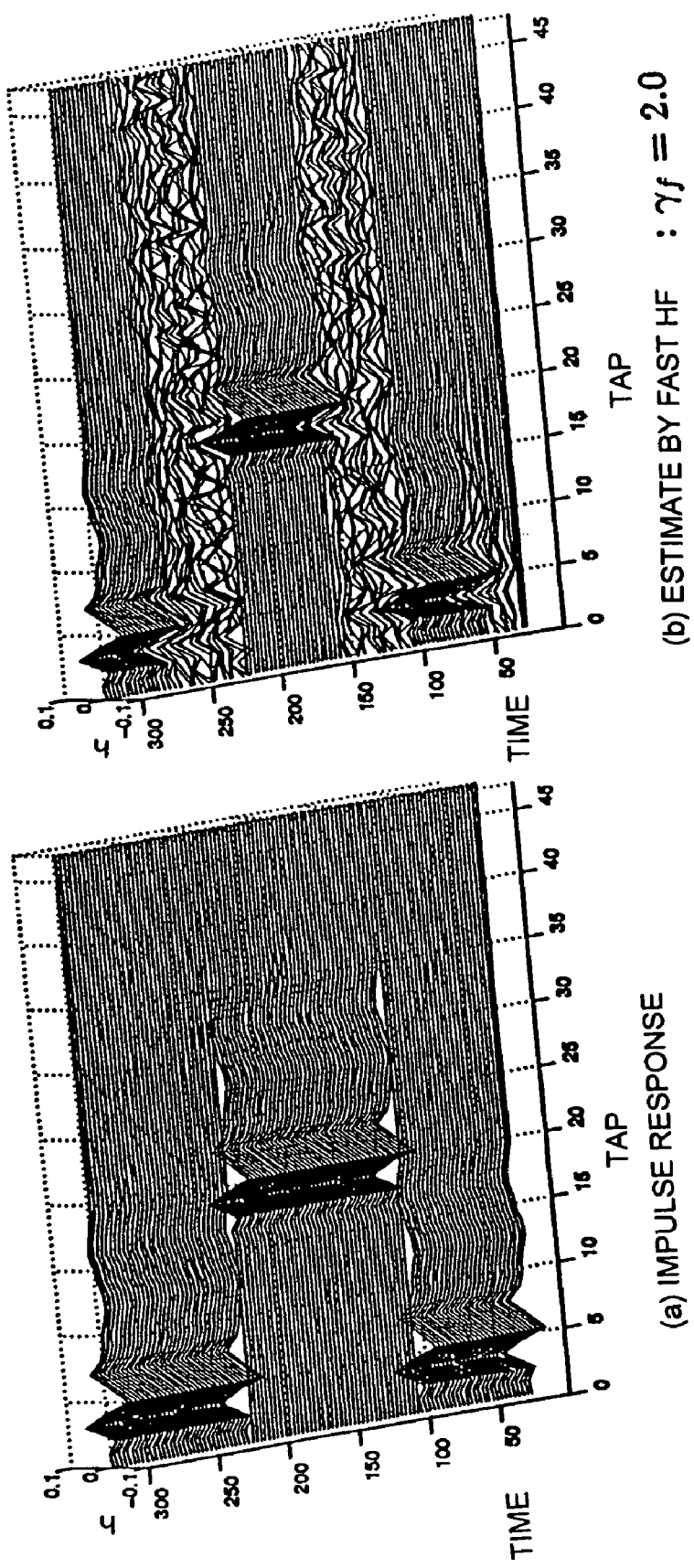
FIG. 10 is a view (1) of simulation results of each algorithm.
Figure 11:
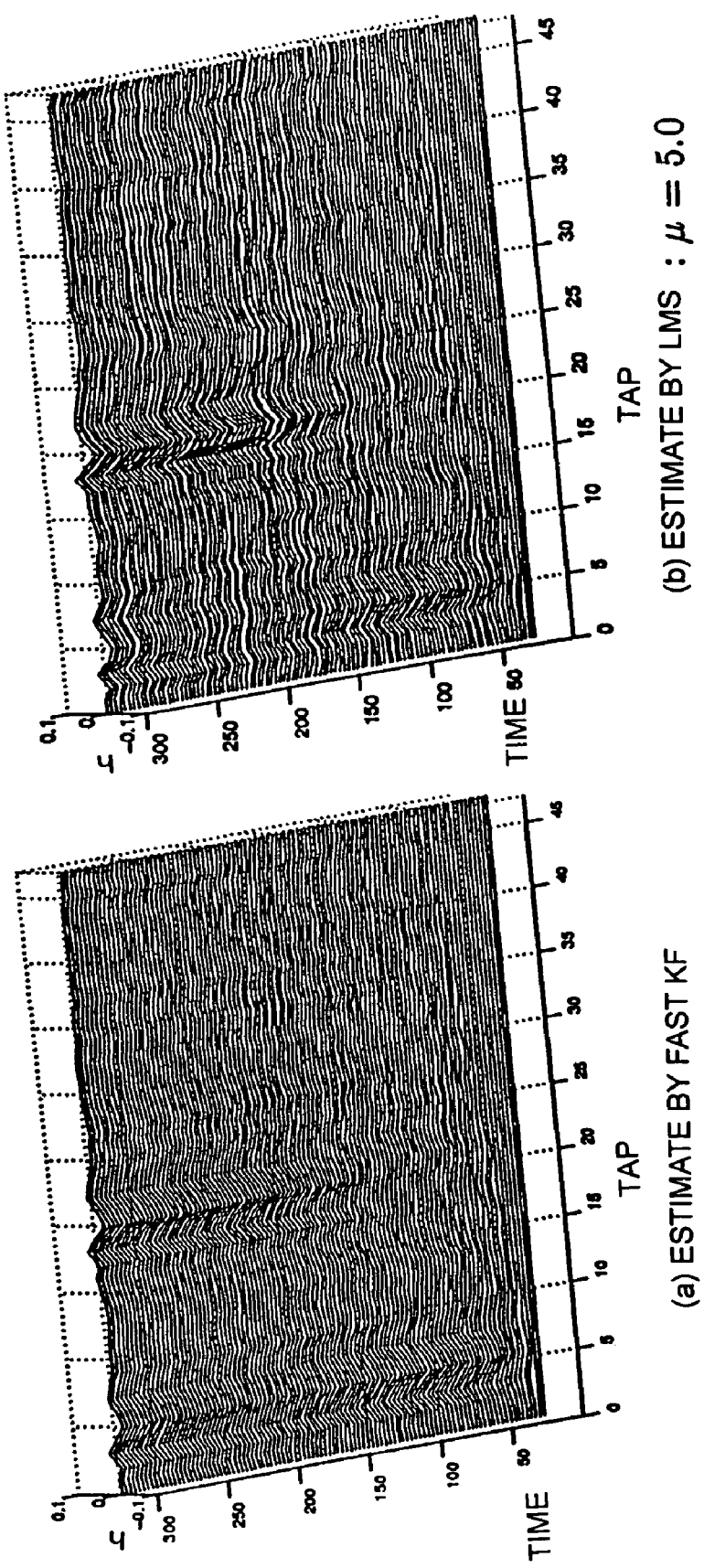
FIG. 11 is a view (2) of simulation results of each algorithm.

FIGS. 10 and 11 are views showing the simulation result of each algorithm. These views show the tracking performance of time-varying systems which employ a fast $H_\infty$ filter (fast HF), a fast Kalman filter (fast KF), and LMS algorithm (LMS). FIG. 10(b) shows the estimates obtained with the fast $H_\infty$ filter when $\gamma_f=2.0$. FIG. 11(a) shows the estimates obtained with the fast Kalman filter. The initial value of the fast $H_\infty$ filter is set such that $\hat{x}_{0|0}=0$ and $\epsilon_o=20$, and the initial value of the fast Kalman filter is set in the same way. FIG. 11(b) shows the estimates obtained by the LMS algorithm, wherein the initial value is set such that $\hat{h}_o=0$, and the step size is set such that $\mu=0.5$ so as to give a stable and rapid convergence. It is found that the tracking performance of the fast $H_\infty$ filter is extremely excellent, and the estimates become stable in about thirty steps after the impulse response is varied. On the other hand, the fast Kalman filter and the LMS algorithm cannot track the impulse response at all.

Generally, the tracking performance of $H_\infty$ filters having no system noise drops with time since the filter gain becomes smaller due to a decay in the diagonal component of $P_{k|k-1}$ and the amount of update of the estimates decreases. In other words, as the number of steps increases, the estimates are updated little. Therefore, in order to improve the tracking performance of Kalman filters and $H_\infty$ filters, an appropriate value needs to be externally added to the diagonal component of the matrix $P_{k|k-1}$. If it is directly added, however, a fast algorithm which uses the shift property of an observation matrix $H_k$ cannot be implemented. It is one of significant features of the present invention to solve this problem theoretically by applying a weight $\rho$ of $1-\gamma_f^{-2}$ to the $H_\infty$ evaluation criterion. The weight $\rho$ appears in an update equation of $S_k$ of the fast $H_\infty$ filtering algorithm, as follows.

(Update of Auxiliary Variable $S_k$ of the Fast $H_\infty$ Filter)

An auxiliary variable $S_k$ of the fast $H_\infty$ filter is indicated by the following expression.

$$S_k = \rho S_{k-1} + e^T_k W_k e_k, \; 0 < \rho = 1 - \gamma_f^{-2} \leq 1$$

In the fast $H_\infty$ filtering algorithm, $S_k$ is used as $S_k^{-1}$ in the equation of $K^u_k$. In order to largely update the filter equation, $S_k^{-1}$ must be larger. In other word, $S_k$ needs to be kept small to make the large update. The existence of $\rho$ prevents $S_k$ from increasing rapidly, which is resultantly equivalent to adding system noise, and thereby the tracking performance is improved. Since the weight $\rho$ is defined as $1-\gamma_f^{-2}$, the tracking performance can be varied by adjusting $\gamma_f$ as confirmed in the simulation.

Figure 12:
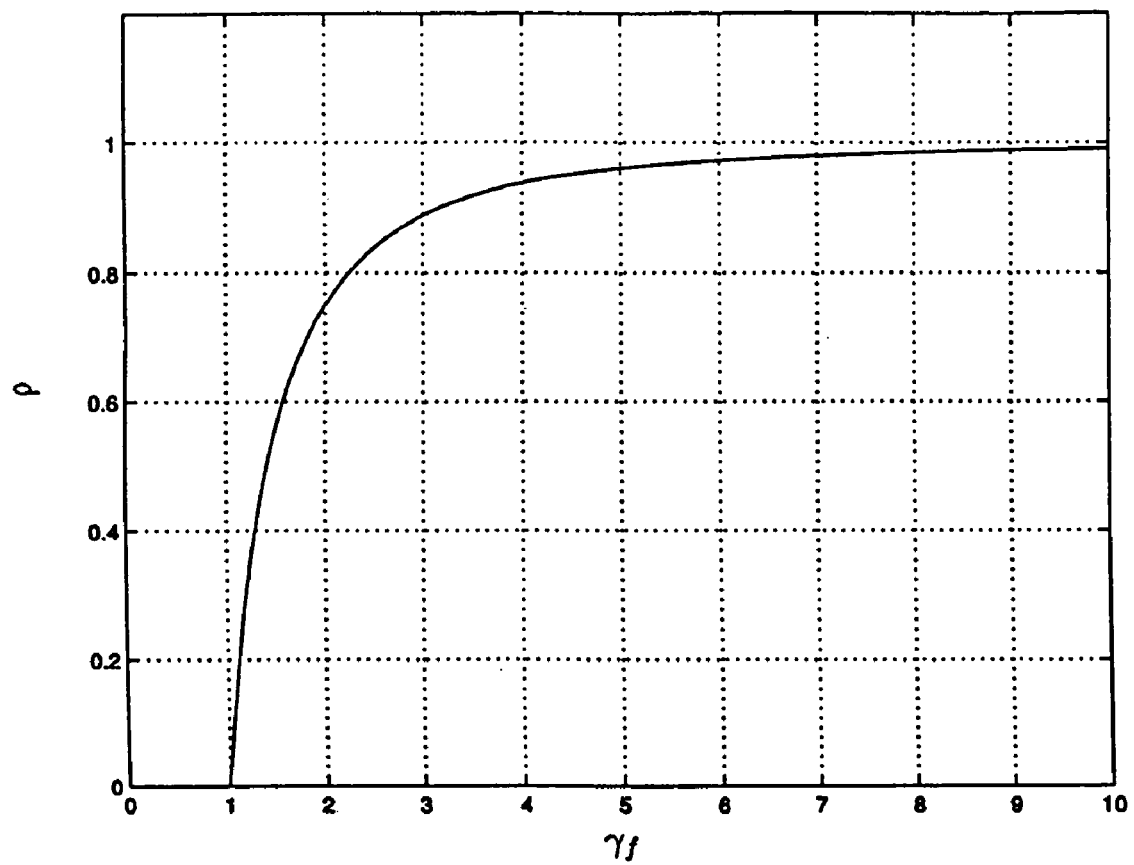
FIG. 12 is a view showing the relationship between $\gamma_f$ and $\rho$.
Figure 14:
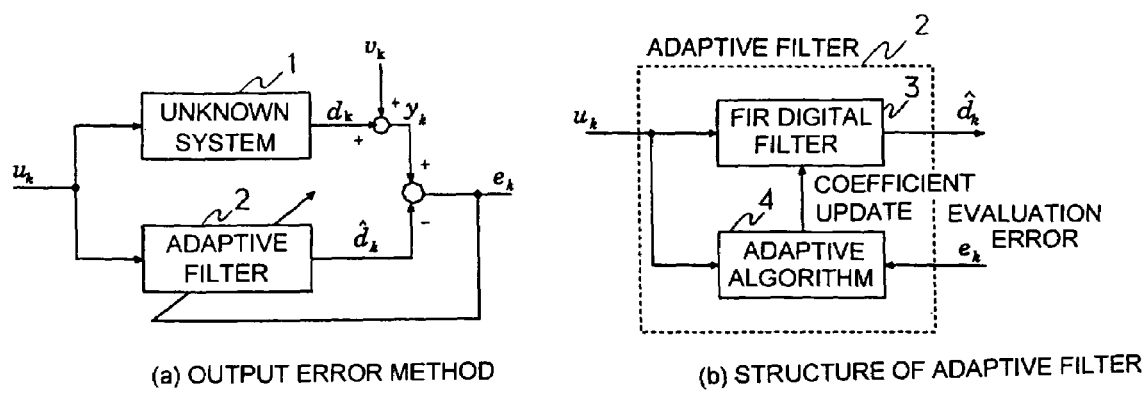
FIG. 14 is a view showing a configuration for system identification.
Figure 15:
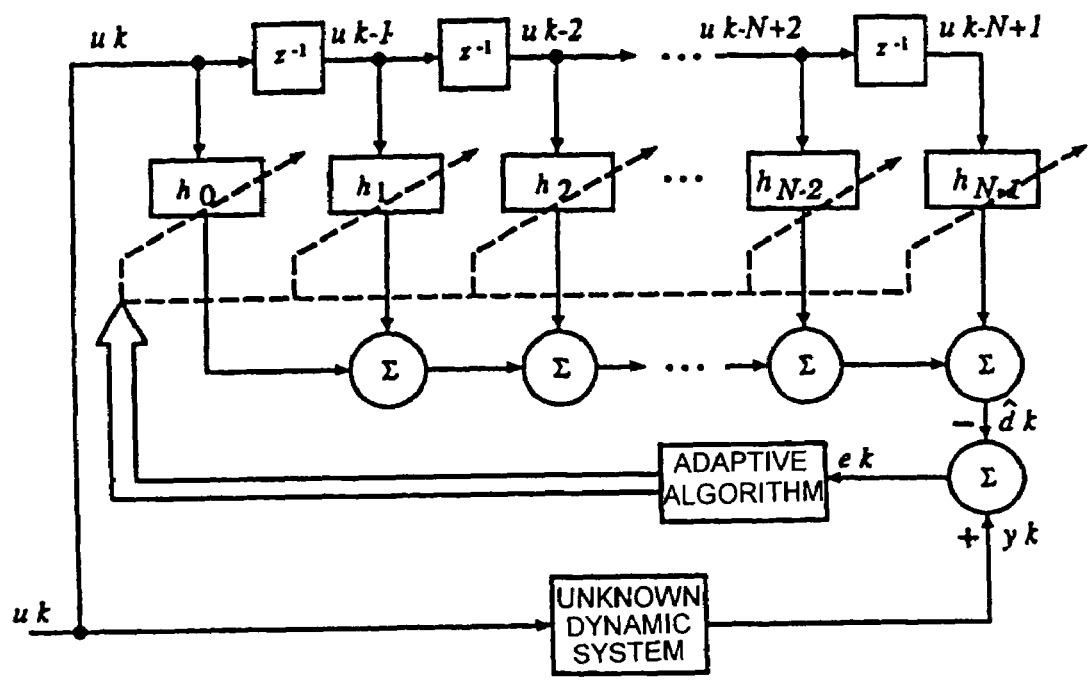
FIG. 15 is a view showing the configuration of an impulse-response adjustment mechanism.
Figure 16:
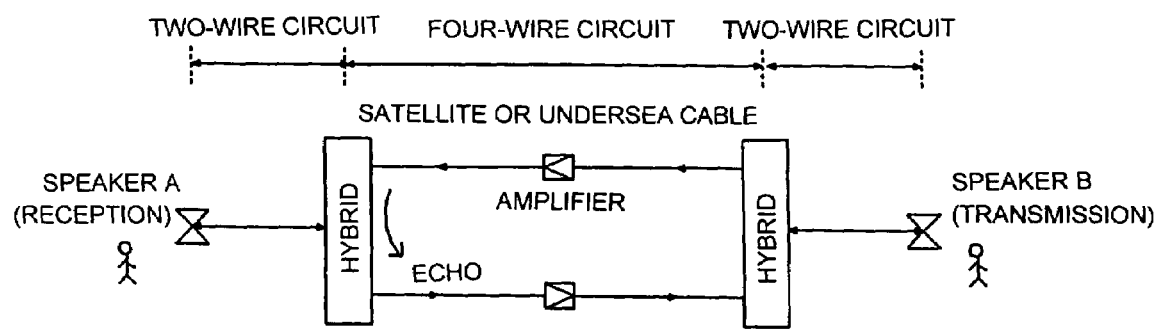
FIG. 16 is an explanation view of a communication system and an echo.
Figure 17:
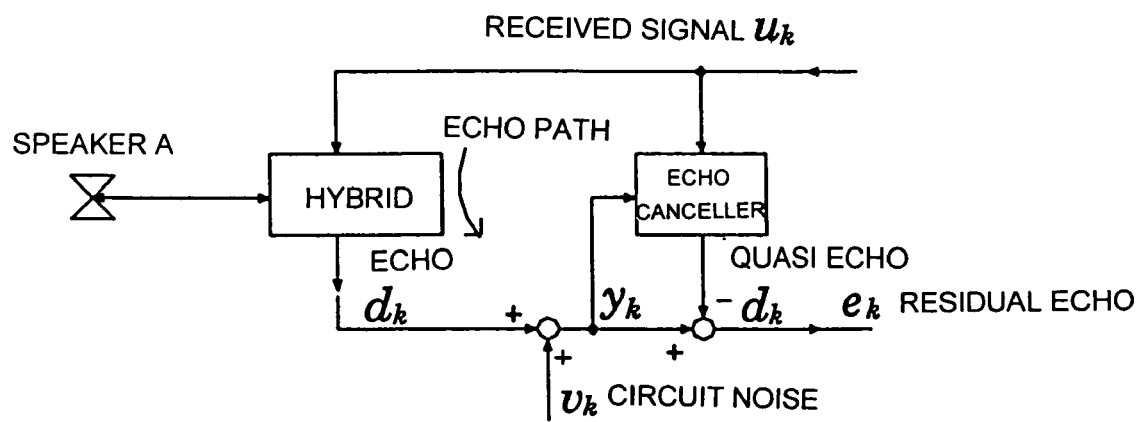
FIG. 17 is a view showing the principle of an echo canceller.

FIG. 12 is a view showing the relationship between $\gamma_f$ and $\rho$. According to the figure, when $\gamma_f=3.0$, $\rho=0.8889$, which means that 89% of $S_{k-1}$ is transmitted to $S_k$. Note that, if $\gamma_f$ is set very small, however, the effect of $S_{k-1}$ is significantly reduced and the existence condition of the filter is not satisfied. When $\gamma_f$ is large, $\rho 1$. An increase in $S_k$ is not suppressed at all, and therefore, the tracking performance drops. When $\gamma_f = \infty (\rho=1$, in particular, the present fast algorithm completely matches the fast Kalman filtering algorithm.

(Evaluation of Computation Time)

FIG. 13 is a view showing the relationship among the tap number and the computation time for the fast $H_\infty$ filter, the fast Kalman filter, and the LMS algorithm, where the number of time steps executed for the filters is 300 and $\gamma_f=3.0$. The computation time was measured for the fast $H_\infty$ filter, the fast Kalman filtering algorithm, and the LMS algorithm when the tap number was increased to 48, 96, 192, and 384 in the cases shown in FIGS. 10 and 11. Because dispersion may occur in one measurement result, the average of four measurement results, [for example,] was used.

It can be confirmed that, in any algorithm, the amount of calculation is in proportion to the tap number. It is also found that when the tap number is large, the computation time for the fast $H_\infty$ filtering algorithm is about a little less than twice the computation time for the fast Kalman filtering algorithm, and is approximately four times longer than that for the LMS algorithm, which is practical. Considering the tracking performance, it can be said that the fast $H_\infty$ filtering algorithm is sufficiently effective.

8. Demonstration of Lemmas

Now, the above-described lemmas will be demonstrated.

(Demonstration of Lemma 1)

The inverse matrix of $P_k$ will be indicated by equation (33). Further, a recursive equation for the matrix $P_k$ can be obtained, as shown in equation (34), by using the matrix inversion lemma.

$$P_k^{-1} = \rho O_{k-1}^T \Omega_{k-1} O_{k-1} + C_k^T W_k C_k \qquad (33)$$
$$= \rho P_{k-1}^{-1} + C_k^T W_k C_k.$$

$$P_k = \left[\rho P_{k-1}^{-1} + [H_k^T \ H_k^T] W_k \begin{bmatrix} H_k \\ H_k \end{bmatrix}\right]^{-1} \qquad (34)$$
$$= \rho^{-1} P_{k-1} - \rho^{-1} P_{k-1}[H_k^T \ H_k^T] \cdot$$
$$\left(W_k^{-1} + \begin{bmatrix} H_k \\ H_k \end{bmatrix} \rho^{-1} P_{k-1}[H_k^T \ H_k^T]\right)^{-1} \cdot \begin{bmatrix} H_k \\ H_k \end{bmatrix} \rho^{-1} P_{k-1},$$
$$\rho P_k = P_{k-1} - P_{k-1}[H_k^T \ H_k^T] \cdot$$
$$\left(R_k + \begin{bmatrix} H_k \\ H_k \end{bmatrix} P_{k-1}[H_k^T \ H_k^T]\right)^{-1} \cdot \begin{bmatrix} H_k \\ H_k \end{bmatrix} P_{k-1},$$
$$P_k = P_{k-1} - P_{k-1}[H_k^T \ H_k^T] \cdot$$
$$\left(R_k + \begin{bmatrix} H_k \\ H_k \end{bmatrix} P_{k-1}[H_k^T \ H_k^T]\right)^{-1} \cdot \begin{bmatrix} H_k \\ H_k \end{bmatrix} P_{k-1} + \gamma_f^{-2} P_k.$$

It is understood, when $P_k$ is replaced with $\hat{P}_{k+1|k}$, that the above equation satisfies the Riccati equation of (14).

(Demonstration of Lemma 2)

The gain matrix $K_k$ can be expressed as follows.

$$K_k = P_k C_k^T = [\rho P_{k-1}^{-1} + C_k^T W_k C_k]^{-1} C_k^T \qquad (35)$$
$$= \rho^{-1} P_{k-1} C_k^T - \rho^{-1} P_{k-1} C_k^T \cdot [W_k^{-1} + C_k \rho^{-1} P_{k-1} C_k^T]^{-1}$$
$$C_k \rho^{-1} P_{k-1} C_k^T$$
$$= \rho^{-1} P_{k-1} C_k^T - \rho^{-1} P_{k-1} C_k^T [W_k^{-1} + C_k \rho^{-1} P_{k-1} C_k^T]^{-1} \cdot$$
$$[(W_k^{-1} + C_k \rho^{-1} P_{k-1} C_k^T) - W_k^{-1}]$$
$$= \rho^{-1} P_{k-1} C_k^T [I + W_k C_k \rho^{-1} P_{k-1} C_k^T]^{-1}$$
$$= \rho^{-1} P_{k-1} C_k^T W_k \cdot [W_k + \rho^{-1} W_k C_k P_{k-1} C_k^T W_k]^{-1}$$
$$= \rho^{-1} P_{k-1} [H_k^T \ -\gamma_f^{-2} H_k^T] \left[\begin{bmatrix} 1 & 0 \\ 0 & -\gamma_f^{-2} \end{bmatrix} + \right.$$
$$\left. \rho^{-1} \begin{bmatrix} H_k \\ -\gamma_f^{-2} H_k \end{bmatrix} P_{k-1}[H_k^T \ -\gamma_f^{-2} H_k^T]\right]^{-1}$$
$$= \rho^{-1} P_{k-1}[H_k^T \ H_k^T](1 + H_k P_{k-1} H_k^T)^{-1}$$

Further, the filter gain can be obtained from the first block column of the gain matrix $K_k$, as shown in equation (18), by using $G_k = (\rho + H_k P_{k-1} H_k^T)/(1 + H_k P_{k-1} H_k^T)$ and $H_k K_k = H_k P_{k-1} H_k^T/(1 + H_k P_{k-1} H_k^T)$.

(Demonstration of Lemma 3)

Assuming that the gain matrix $K_i$ (i=0, . . . , and k) is given, the following matrix, $K_{k+1}$, will be calculated.

$$Q_{k+1} K_{k+1} = C_{k+1}^T \qquad (36)$$

First, equations (37) and (38) are newly introduced to utilize the shift property of $C_k$. $Q_k^U$ is expressed recursively as shown in equation (39), and is divided as in the following equation (40).

$$\breve{C}_k^T = \begin{bmatrix} c_k^T \\ C_k^T \end{bmatrix} = \begin{bmatrix} C_{k+1}^T \\ c_{k-N}^T \end{bmatrix} \in R^{(N+1)\times 2} \qquad (37)$$

$$\breve{Q}_k = \sum_{i=1}^{k} \rho^{k-i} \breve{C}_i^T W_i \breve{C}_i \in R^{(N+1)\times(N+1)} \qquad (38)$$

$$\breve{Q}_k = \rho \breve{Q}_{k-1} + \breve{C}_k^T W_k \breve{C}_k. \qquad (39)$$

$$\breve{Q}_k = \begin{bmatrix} M_k & T_k^T \\ T_k & Q_k \end{bmatrix} = \begin{bmatrix} Q_{k+1} & \underline{T}_k^T \\ \underline{T}_k & \underline{M}_k \end{bmatrix}. \qquad (40)$$

Using this notation, equation (36) of the time steps k and k+1 is included in the following equation.

$$\breve{Q}_k \begin{bmatrix} 0 \\ K_k \end{bmatrix} = \begin{bmatrix} \alpha_k^T \\ C_k^T \end{bmatrix} = \breve{C}_k^T + \begin{bmatrix} \alpha_k^T - c_k^T \\ 0 \end{bmatrix} \qquad (41)$$

$$\breve{Q}_k \begin{bmatrix} K_{k+1} \\ 0 \end{bmatrix} = \begin{bmatrix} C_{k+1}^T \\ \beta_k^T \end{bmatrix} = \breve{C}_k^T + \begin{bmatrix} 0 \\ \beta_k^T - c_{k-N}^T \end{bmatrix} \qquad (42)$$

where, $$\alpha_k^T = T_k^T K_k \in R^{1\times 2}, \ \beta_k^T = \underline{T}_k K_{k+1} \in R^{1\times 2}.$$

Based on the notation, it is more convenient to obtain $K_k^U \in R^{(N+1)\times 2}$, which satisfies the following equation, than to obtain $K_k$ directly.

$$\breve{Q}_k \breve{K}_k = \breve{C}_k^T \qquad (43)$$

where, $$\breve{K}_k = [k_{k+1}^T K_k^T]^T = [K_{k+1}^T k_{k-N}^T]^T. \qquad (44)$$

To this end, $K_k^U \in R^{(N+1)\times 2}$ can be expressed as shown in equation (46) by using equation (45), obtained from equation (41).

$$\breve{C}_k^T = \breve{Q}_k \begin{bmatrix} 0 \\ K_k \end{bmatrix} - \begin{bmatrix} \alpha_k^T - c_k^T \\ 0 \end{bmatrix} \qquad (45)$$

$$\breve{K}_k = \begin{bmatrix} m_k \\ \mu_k \end{bmatrix} = \breve{Q}_k^{-1} \breve{C}_k^T = \begin{bmatrix} 0 \\ K_k \end{bmatrix} - \breve{Q}_k^{-1} \begin{bmatrix} \alpha_k^T - c_k^T \\ 0 \end{bmatrix} \qquad (46)$$

$$= \begin{bmatrix} 0 \\ K_k \end{bmatrix} - \begin{bmatrix} S_k^{-1} \\ A_k S_k^{-1} \end{bmatrix}[\alpha_k^T - c_k^T]$$

Here, $K_k^U$ is divided into $m_k \in R^{N\times 2}$ and $\mu_k \in R^{1\times 2}$. Also note that $\alpha_k^T - c_k^T = -(c_k^T + A_k^T C_k^T)$. Further, assuming that $Q_k^U$ has an inverse matrix, auxiliary variables $A_k \in R^{N\times 1}$ and $S_k \in R$ satisfy the following equation.

$$\breve{Q}_k \begin{bmatrix} 1 \\ A_k \end{bmatrix} = \begin{bmatrix} S_k \\ 0 \end{bmatrix} \left( \begin{bmatrix} 1 \\ A_k \end{bmatrix} S_k^{-1} = \breve{Q}_k^{-1} \begin{bmatrix} 1 \\ 0 \end{bmatrix} \right) \quad (47)$$

where, the bottom block of the above equation means $T_k + Q_k A_k = 0$ or $T_k^T = -A_k^T Q_k^T$.

Next, auxiliary variables $B_k \in R^{N \times 1}$ and $F_k \in R$ such as those shown in the following equation (48) are introduced to delete $\mu_k$ in equation (46) without affecting the top block of $C_k^T$. Further, subtracting $B_k^U F_k^{-1} \mu_k$ from $K_k^U$ in equation (46) provides equation (49).

$$\breve{Q}_k \breve{B}_k = \breve{Q}_k \begin{bmatrix} B_k \\ F_k \end{bmatrix} = \begin{bmatrix} 0 \\ 1 \end{bmatrix} \left( \breve{B}_k = \begin{bmatrix} B_k \\ F_k \end{bmatrix} \right) \quad (48)$$

$$\breve{K}_k - \breve{B}_k F_k^{-1} \mu_k = \begin{bmatrix} m_k \\ \mu_k \end{bmatrix} - \begin{bmatrix} B_k F_k^{-1} \\ 1 \end{bmatrix} \mu_k \quad (49)$$
$$= \begin{bmatrix} m_k - B_k F_k^{-1} \mu_k \\ 0 \end{bmatrix}$$

Then, the left-hand side of equation (49) is multiplied by $Q_k^U$ from the left to obtain the following equation.

$$\breve{Q}_k (\breve{K}_k - \breve{B}_k F_k^{-1} \mu_k) = \breve{Q}_k \breve{K}_k - \breve{Q}_k \breve{B}_k F_k^{-1} \mu_k \quad (50)$$
$$= \breve{C}_k^T - \begin{bmatrix} 0 \\ 1 \end{bmatrix} F_k^{-1} \mu_k$$
$$= \breve{C}_k^T - \begin{bmatrix} 0 \\ F_k^{-1} \mu_k \end{bmatrix}$$

Equation (49) is substituted for the left-hand side of the above equation. Then, equation (43) is expressed as follows:

$$\breve{Q}_k (\breve{K}_k - \breve{B}_k F_k^{-1} \mu_k) = \breve{C}_k^T - \begin{bmatrix} 0 \\ F_k^{-1} \mu_k \end{bmatrix}, \quad (51)$$

$$\begin{bmatrix} Q_{k+1} & T_k^T \\ T_k & M_k \end{bmatrix} \begin{bmatrix} m_k - B_k F_k^{-1} \mu_k \\ 0 \end{bmatrix} = \begin{bmatrix} C_{k+1}^T \\ c_{k-N}^T \end{bmatrix} + \begin{bmatrix} 0 \\ -F_k^{-1} \mu_k \end{bmatrix}$$

This is the same form as equation (42). The following equation (52) can be obtained from the top block of equation (51).

$$Q_{k+1}(m_k - B_k F_k^{-1} \mu_k) = C_{k+1}^T \quad (52)$$

Equations (36) and (52) are compared to obtain the update equation of the gain matrix $K_k$.

(Lemma 4)

The auxiliary variables $A_k$ and $S_k$ can be obtained as follows:

$$A_k = A_{k-1} - K_k W_k [c_k + C_k A_{k-1}] \in R^{N \times 1} \quad (53)$$

$$S_k = \rho S_{k-1} + [c_k^T + A_k^T C_k^T] W_k [c_k + C_k A_{k-1}] \in R \quad (54)$$

where, $A_{-1} = 0$, and $S_{-1} = 1/\epsilon_0$.

(Demonstration) By using the equation (55) of $A_k$ and $S_k$ and equation (39), equation (56) is obtained.

$$\breve{Q}_{k-1} \begin{bmatrix} 1 \\ A_{k-1} \end{bmatrix} = \begin{bmatrix} S_{k-1} \\ 0 \end{bmatrix} \quad (55)$$

$$\breve{Q}_k \begin{bmatrix} 1 \\ A_{k-1} \end{bmatrix} = \rho \breve{Q}_{k-1} \begin{bmatrix} 1 \\ A_{k-1} \end{bmatrix} + \breve{C}_k^T W_k [c_k + C_k A_{k-1}] \quad (56)$$
$$= \begin{bmatrix} \rho S_{k-1} \\ 0 \end{bmatrix} + \begin{bmatrix} c_k^T \\ C_k^T \end{bmatrix} W_k [c_k + C_k A_{k-1}]$$

On the other hand, the following equation is obtained by multiplying both sides of equation (41) by $W_k$.

$$\breve{Q}_k \begin{bmatrix} 0 \\ K_k \end{bmatrix} W_k [c_k + C_k A_{k-1}] = \begin{bmatrix} \alpha_k \\ C_k^T \end{bmatrix} W_k [c_k + C_k A_{k-1}]. \quad (57)$$

By subtracting equation (57) from equation (56), the following equation (58) is formed.

$$\breve{Q}_k \left[ \begin{bmatrix} 1 \\ A_{k-1} \end{bmatrix} - \begin{bmatrix} 0 \\ K_k \end{bmatrix} W_k [c_k + C_k A_{k-1}] \right] = \quad (58)$$
$$\begin{bmatrix} \rho S_{k-1} \\ 0 \end{bmatrix} + \begin{bmatrix} c_k^T \\ C_k^T \end{bmatrix} W_k [c_k + C_k A_{k-1}] - \begin{bmatrix} \alpha_k^T \\ C_k^T \end{bmatrix} W_k [c_k + C_k A_{k-1}],$$
$$\breve{Q}_k \begin{bmatrix} 1 \\ A_{k-1} - K_k W_k [c_k + C_k A_{k-1}] \end{bmatrix} =$$
$$\begin{bmatrix} \rho S_{k-1} + [c_k^T - \alpha_k^T] W_k [c_k + C_k A_{k-1}] \\ 0 \end{bmatrix}$$

This equation is compared with equation (47). Since $\alpha_k^T = T_k^T K_k = -A_k^T C_k^T$, equations (53) and (54) are obtained.

(Lemma 5)

The auxiliary variable $D_k = B_k F_k^{-1}$ is obtained by the following equation (59). $F_k$ is updated by the following equation (60).

$$D_k = [D_{k-1} - m_k W_k \eta_k][1 - \mu_k W_k \eta_k]^{-1} \in R^{N \times 1} \quad (59)$$

$$F_k = F_{k-1}[1 - \mu_k W_k \eta_k]/\rho \in R \quad (60)$$

where, $\eta_k = C_k^U D_{k-1}^U = C_{k-N} + C_{k+1} D_{k-1}$, $D_{-1} = 0$, and $F_{-1} = 0$.

(Demonstration) In order to update $B_k$ and $F_k$, equation (62) is formed by using equation (61).

$$\breve{Q}_{k-1} \breve{B}_{k-1} = \breve{Q}_{k-1} \begin{bmatrix} B_{k-1} \\ F_{k-1} \end{bmatrix} = \begin{bmatrix} 0 \\ 1 \end{bmatrix} \quad (61)$$

$$\breve{Q}_k \breve{B}_{k-1} = \rho \breve{Q}_{k-1} \breve{B}_{k-1} + \breve{C}_k^T W_k \breve{C}_k \breve{B}_{k-1} \quad (62)$$
$$= \rho \begin{bmatrix} 0 \\ 1 \end{bmatrix} + \breve{C}_k^T W_k \breve{C}_k \breve{B}_{k-1}$$

In order to modify the above equation so as to have the same form as equation (61), $C_k^{U T} W_k C_k^U B_{k-1}^U$ is subtracted from equation (62) to obtain the following equation.

$$\check{Q}_k \check{B}_{k-1} - \check{C}_k^T W_k \check{C}_k \check{B}_{k-1} = \check{Q}_k \check{B}_{k-1} - \check{Q}_k \check{K}_k W_k \check{C}_k \check{B}_{k-1} = \rho \begin{bmatrix} 0 \\ 1 \end{bmatrix}, \quad (63)$$

$$\check{Q}_k [\check{B}_{k-1} - \check{K}_k W_k \check{C}_k \check{B}_{k-1}] = \rho \begin{bmatrix} 0 \\ 1 \end{bmatrix}$$

Comparing the above last equation with equation (48) yields a recursive equation for $B^U_k$.

$$\check{B}_k = (\check{B}_{k-1} - \check{K}_k W_k \check{C}_k \check{B}_{k-1})/\rho \quad (64)$$

$$D_k = B_k F_k^{-1}, \check{D}_k = \check{B}_k F_k^{-1} = \begin{bmatrix} D_k \\ 1 \end{bmatrix} \quad (65)$$

$B_k$ and $F_k$ are updated by this equation.

Since they appear only as a combination of $D^U_k = B^U_k F_k^{-1}$ or $D_k = B_k F_k^{-1} \in R^{N \times 1}$, however, it is more convenient to express equations (48) and (64) with equation (65). The matrix $D_k$ satisfies the following equation (66).

$$\check{Q}_k \check{D}_k = \check{Q}_k \check{B}_k F_k^{-1} = \begin{bmatrix} 0 \\ 1 \end{bmatrix} F_k^{-1}, \check{Q}_k \begin{bmatrix} D_k \\ 1 \end{bmatrix} = \begin{bmatrix} 0 \\ F_k^{-1} \end{bmatrix} \quad (66)$$

$$\check{Q}_k [\check{B}_{k-1} F_{k-1}^{-1} - \check{K}_k W_k \check{C}_k \check{B}_{k-1} F_{k-1}^{-1}] = \check{Q}_k [\check{D}_{k-1} - \check{K}_k W_k \check{C}_k \check{D}_{k-1}] \quad (67)$$

$$= \begin{bmatrix} 0 \\ \rho F_{k-1}^{-1} \end{bmatrix}$$

Next, equation (63) is multiplied by $F_{k-1}^{-1}$ to obtain equation (67), and is further expressed by the following equation (68) when $D^U_{k-1} = B^U_{k-1} F_{k-1}^{-1}$ is used.

$$\check{Q}_k \left[ \check{D}_{k-1} - \begin{bmatrix} m_k \\ \mu_k \end{bmatrix} W_k \check{C}_k \check{D}_{k-1} \right] = \begin{bmatrix} 0 \\ \rho F_{k-1}^{-1} \end{bmatrix}, \quad (68)$$

$$\check{Q}_k \begin{bmatrix} D_{k-1} - m_k W_k \check{C}_k \check{D}_{k-1} \\ 1 - \mu_k W_k \check{C}_k \check{D}_{k-1} \end{bmatrix} = \begin{bmatrix} 0 \\ \rho F_{k-1}^{-1} \end{bmatrix}$$

Therefore, the following equation is obtained when equation (68) is multiplied by $[1 - \mu_k W_k C^U_k D^U_{k-1}]^{-1}$.

$$\check{Q}_k \begin{bmatrix} [D_{k-1} - m_k W_k \check{C}_k \check{D}_{k-1}][1 - \mu_k W_k \check{C}_k \check{D}_{k-1}]^{-1} \\ 1 \end{bmatrix} =$$

$$\begin{bmatrix} 0 \\ \rho F_{k-1}^{-1} [1 - \mu_k W_k \check{C}_k \check{D}_{k-1}]^{-1} \end{bmatrix}$$

By comparing this equation with equation (66), an update equation for $D_k$ and $F_k$ is finally obtained.

(Demonstration of Lemma 6 (Existence Condition Suitable for Fast Processing))

As described above, the existence of the fast $H_\infty$ filter can be checked with the computational complexity of O(N) by using the existence condition of equations (22) and (23). A demonstration thereof will be shown below.

When the characteristic equation of a 2×2 matrix $R_{e,k}$ shown in the following equation (69) is solved, a eigenvalue $\lambda_i$ of $R_{e,k}$ is obtained by the following equation (70).

$$|\lambda I - R_{e,k}| = \begin{vmatrix} \lambda - (\rho + H_k \hat{\Sigma}_{k|k-1} H_k^T) & -H_k \hat{\Sigma}_{k|k-1} H_k^T \\ -H_k \hat{\Sigma}_{k|k-1} H_k^T & \lambda - (-\rho \gamma_f^2 + H_k \hat{\Sigma}_{k|k-1} H_k^T) \end{vmatrix} \quad (69)$$

$$= \lambda^2 - (2H_k \hat{\Sigma}_{k|k-1} H_k^T + \rho l)\lambda - \rho^2 \gamma_f^2 + \rho \varrho H_k \hat{\Sigma}_{k|k-1} H_k^T = 0$$

$$\lambda_i = \frac{\Phi \pm \sqrt{\Phi^2 - 4\rho \varrho H_k \hat{\Sigma}_{k|k-1} H_k^T + 4\rho^2 \gamma_f^2}}{2} \quad (70)$$

where, $$\Phi = 2H_k \hat{\Sigma}_{k|k-1} H_k^T + \rho l, l = 1 - \gamma_f^2$$

If the following expression (71) is satisfied, one of the two eigenvalues of the matrix $R_{e,k}$ is positive and the other is negative, and the matrixes $R_k$ and $R_{e,k}$ have the same inertia. Therefore, the existence condition of equation (22), i.e. (71) is obtained by using the following equation (72). Here, the calculation of $H_k K_k$ requires the same number of multiplications as O(N).

$$-4\rho l H_k \hat{\Sigma}_{k|k-1} H_k^T + 4\rho^2 \gamma_f^2 > 0 \quad (71)$$

$$H_k \hat{\Sigma}_{k|k-1} H_k^T = \frac{H_k \check{K}_k}{1 - H_k \check{K}_k} \quad (72)$$

INDUSTRIAL APPLICABILITY

According to the present invention, as described above, the fast real-time identification of time-invariant and time-variant systems can be implemented by using the fast algorithm (fast $H_\infty$ filtering algorithm) for the modified $H_\infty$ filters developed based on the new $H_\infty$ evaluation criterion. In addition, according to the present invention, the present algorithm includes, as a particular case, the fast Kalman filtering algorithm, and a term corresponding to the covariance of system noise which is dominant in the tracking performance of a time-varying system can be theoretically determined. Further, according to the present invention, a fast time-varying system identification method can be provided, which is very effective particularly when a system (impulse response) is varied discontinuously with time, such as an echo canceller for a time-varying system which varies extremely as sudden line switching. Furthermore, according to the present invention, a system identification method can be provided, which is applicable to echo cancellers in communication systems and acoustic systems, sound-field reproduction, and noise control.

Although embodiments of the invention have been shown and described, it is to be understood that various modifications and substitutions, as well as rearrangements of method steps and equipment, can be made by those skilled in the art without departing from the novel spirit and scope of the invention.

What is claimed is:

1. A system identification apparatus for performing a fast real-time identification of a time-invariant or time-variant system,
comprising a filter robust against disturbances, said filter is formed by setting, as an $H_\infty$ evaluation criterion, a maximum energy gain from disturbances weighted by $\rho = 1 - \gamma_f^{-2}$ and $\Sigma_{wi} = \gamma_f^{-2} P_{i+1|i}$ to a filter error to be smaller than a predetermined upper limit $\gamma_f^2$,
wherein said filter, for a state-space model as in the following equations (7) to (9),
satisfies the evaluation criterion by expression (10) and is given by the following equations (11) to (15), $$\hat{x}_{k+1|k+1} = \hat{x}_{k|k} + K_{s,k+1}(y_{k+1} - H_{k+1}\hat{x}_{k|k}) \quad (15)$$

where,
$\hat{x}_{k|k}$: The estimate of state $x_k$ at time k, obtained by using observation signals $y_0$ to $y_k$
$y_k$: Observation signal
$K_{s,k+1}$: Filter gain
$H_k$: Observation matrix $$x_{k+1} = x_k + w_k, \; w_k, \; x_k \in R^N \quad (7)$$

$$y_k = H_k x_k + v_k, \; y_k, \; v_k \in R \quad (8)$$

$$z_k = H_k x_k, \; z_k \in R, \; H_k \in R^{1 \times N} \quad (9)$$

$$\sup_{x_0, \{\omega_i\}, \{v_i\}} \frac{\sum_{i=0}^{k} \|e_{f,i}\|^2 / \rho}{\|x_0 - \check{x}_{0|-1}\|^2_{\Sigma_0^{-1}} + \sum_{i=0}^{k} \|\omega_i\|^2_{\Sigma_{\omega_i}^{-1}} + \sum_{i=0}^{k} \|v_i\|^2 / \rho} < \gamma_f^2 \quad (10)$$

$$\check{z}_{k|k} = H_k \hat{x}_{k|k} \quad (11)$$

$$\hat{x}_{k+1|k+1} = \hat{x}_{k|k} + K_{s,k+1}(y_{k+1} - H_{k+1}\hat{x}_{k|k}) \text{ Filter equation} \quad (12)$$

$$K_{s,k+1} = \hat{P}_{k+1|k} H_{k+1}^T (H_{k+1}\hat{P}_{k+1|k}H_{k+1}^T + \rho)^{-1} \text{ Filter gain} \quad (13)$$

$$\hat{P}_{k+1|k} = \quad \text{Riccati equation} \quad (14)$$
$$\hat{P}_{k|k-1} - \hat{P}_{k|k-1}[H_k^T H_k^T]R_{e,k}^{-1}\begin{bmatrix}H_k \\ H_k\end{bmatrix}\hat{P}_{k|k-1} + \sum_{\omega_k}$$

where, $$e_{j,i} = \hat{z}_{i|i} - H_i x_i \quad (15)$$

$$R_{e,k} = R_k + \begin{bmatrix}H_k \\ H_k\end{bmatrix}\hat{P}_{k|k-1}[H_k^T H_k^T]$$

$$R_k = \begin{bmatrix}\rho & 0 \\ 0 & -\rho\gamma_f^2\end{bmatrix}, \Sigma_{wk} = \gamma_f^{-2}\hat{P}_{k+1|k}$$

$$\hat{P}_{k|k-1}^{-1} + H_k^T H_k > 0, \; \hat{P}_{1|0} = \varepsilon_0 I, \; \varepsilon_0 > 0$$

$$0 < \rho = 1 - \gamma_f^{-2} \le 1, \; \gamma_f > 1$$

and the existence condition is given by the inequality $P_{k|k-1}^{-1} + H_k^T H_k > 0$ which appears in (15),
where, the notation is used as follows, $x_k$: State vector or just state, unknown and to be estimated,
$x_0$: Initial state, unknown,
$w_k$: System noise, unknown,
$v_k$: Observation noise, unknown,
$y_k$: Observation signal, known and input to a filter,
$z_k$: Output signal, unknown,
$H_k$: Observation matrix, known,
$\hat{x}_{k|k}$: State value of the state $x_k$ at time k, estimated by using observation signals $y_0$ to $y_k$, given by the filter equation,
$\hat{x}_{0|0}$: Initial estimate of a state, essentially unknown but set to 0 for convenience,
$K_{s,k+1}$: Filter gain, obtained by matrix $\hat{P}_{k+1|k}$,
$\Sigma_{wk}$: Corresponds to the covariance matrix of the system noise, known in theory but unknown in advance,
$\hat{P}_{k|k-1}$: Corresponds to the covariance matrix of the error of $\hat{x}_{k|k-1}$, given by a Riccati equation,
$\hat{P}_{1|0}$: Corresponds to the covariance matrix of an error in the initial state, essentially unknown but set to $\epsilon_0 I$ for convenience.

2. A system identification apparatus according to claim 1, setting initial conditions of a recursive equation of the gain matrix $K_k$, the auxiliary variables $A_k$, $S_k$, $D_k$, and the state estimate $x_{k|k}$, respectively, as follows, $$K_0 = 0, \; A_{-1} = 0, \; S_{-1} = \frac{\rho}{\varepsilon_0}, \; D_{-1} = 0, \; \hat{x}_{0|0} = 0$$

recursively determining the auxiliary variables $A_k$ and $S_k$ at time k as follows, $$\tilde{e}_k = c_k + C_k A_{k-1} \quad \epsilon R^{2 \times 1}$$
$$A_k = A_{k-1} - K_k W_k \tilde{e}_k \quad \epsilon R^{N \times 1}$$
$$e_k = c_k + C_k A_k \quad \epsilon R^{2 \times 1}$$
$$S_k = \rho S_{k-1} + e_k^T W_k \tilde{e}_k \quad \epsilon R$$

obtaining a second gain matrix in which a row including the auxiliary variables is added to the gain matrix $K_k$ as follows, $$\check{K}_k = \begin{bmatrix} S_k^{-1} e_k^T \\ K_k + A_k S_k^{-1} e_k^T \end{bmatrix} \in R^{(N+1) \times 2}$$

dividing the second gain matrix $K^U_k$ and obtaining first and second divisional gain matrixes as follows, $$\check{K}_k = \begin{bmatrix} m_k \\ \mu_k \end{bmatrix} \quad m_k \in R^{N \times 2}, \; \mu_k \in R^{1 \times 2}$$

determine $D_k$, and obtaining a gain matrix $K_{k+1}$ at time k+1, and obtaining a filter gain $K_{s,k+1}$ at time k+1 by the following equations including the first and second divisional gain matrixes, $$\eta_k = c_{k-N} + C_{k+1} D_{k-1}$$

$$D_k = [D_{k-1} - m_k W_k \eta_k][1 - \mu_k W_k \eta_k]^{-1}$$

$$K_{k+1} = m_k - D_k \mu_k$$

$$\tilde{K}_{k+1}(i) = \rho K_{k+1}(i, 1), \ i=1, \ldots, N$$

$$K_{s,k+1} = G_{k+1}^{-1} \tilde{K}_{k+1}, \ G_{k+1} = \rho + \gamma_f^{-2} H_{k+1} \tilde{K}_{k+1}$$

in which $\eta_k \in R^{2\times 1}$, $D_k \in R^{N\times 1}$, $K_{k+1} \in R^{N\times 2}$, $K_{s,k+1} \in R^{N\times 1}$, $0 < \rho = 1 - \gamma_f^{-2} \leq 1$, $\gamma_f > 1$, updating the filter equation (12) according to the obtained filter gain $K_{s,k+1}$ as follows, $$\hat{x}_{k+1|k+1} = \hat{x}_{k|k} + K_{s,k+1}(y_{k+1} - H_{k+1}\hat{x}_{k|k})$$

and repeating each of the above means with the time being put forward, wherein the existence of the filter is checked by using the following equation as an existence condition suitable for fast processing, with the computational complexity of O(N), $$-l\hat{\Xi}i + \rho\gamma_f^2 > 0, \ i=0, \ldots, k$$

where, $$\varrho = 1 - \gamma_f^2, \ \hat{\Xi}_i = \frac{H_i \tilde{K}_i}{1 - H_i \tilde{K}_i}$$

.

3. A system identification apparatus according to claim 2, wherein an echo canceller is implemented by applying the filter to obtain the state estimate $\hat{x}_{k|k}$, producing a quasi echo as in the following equation, and canceling an actual echo by the obtained quasi echo, $$\hat{d}_k = H_k \hat{x}_{k|k} = \sum_{i=0}^{N-1} \hat{h}_i[k] u_{k-i}$$

$$H_k = [u_k, \ldots, u_{k-N+1}]$$

where,
 $\hat{d}_k$ Quasi-echo
 $u_k$ Received signal
 N Tap number
 $\hat{h}_i[k]$ Estimate of impulse response of echo path.

4. A system identification apparatus according to claim 1, wherein an echo canceller is implemented by applying the filter to obtain the state estimate $\hat{x}_{k|k}$, producing a quasi echo as in the following equation, and canceling an actual echo by the obtained quasi echo, $$\hat{d}_k = H_k \hat{x}_{k|k} = \sum_{i=0}^{N-1} \hat{h}_i[k] u_{k-i}$$

$$H_k = [u_k, \ldots, u_{k-N+1}]$$

where,
 $\hat{d}_k$ Quasi-echo
 $u_k$ Received signal
 N Tap number
 $\hat{h}_i[k]$ Estimate of impulse response of echo path.

* * * * *